US010605824B2

(12) United States Patent
Machida et al.

(10) Patent No.: US 10,605,824 B2
(45) Date of Patent: Mar. 31, 2020

(54) MEMS MANUFACTURING METHOD AND MEMS MANUFACTURING APPARATUS

(71) Applicant: Hitachi, Ltd., Chiyoda-ku, Tokyo (JP)

(72) Inventors: Shuntaro Machida, Tokyo (JP); Nobuyuki Sugii, Tokyo (JP); Keiji Watanabe, Tokyo (JP); Daisuke Ryuzaki, Tokyo (JP); Tetsufumi Kawamura, Tokyo (JP); Kazuki Watanabe, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/763,240

(22) PCT Filed: Mar. 18, 2016

(86) PCT No.: PCT/JP2016/058681
§ 371 (c)(1),
(2) Date: Mar. 26, 2018

(87) PCT Pub. No.: WO2017/158815
PCT Pub. Date: Sep. 21, 2017

(65) Prior Publication Data
US 2018/0267075 A1 Sep. 20, 2018

(51) Int. Cl.
G01P 15/08 (2006.01)
B81C 99/00 (2010.01)
G01P 15/125 (2006.01)

(52) U.S. Cl.
CPC ........ G01P 15/0802 (2013.01); B81C 99/001 (2013.01); B81C 99/0025 (2013.01);
(Continued)

(58) Field of Classification Search
CPC ........ B81C 99/002; B81C 99/003–005; B81C 2201/0143
See application file for complete search history.

(56) References Cited

U.S. PATENT DOCUMENTS 6,590,212 B1 7/2003 Joseph et al.
6,847,907 B1 * 1/2005 Novotny ............. B81C 99/0045
438/17
(Continued)

FOREIGN PATENT DOCUMENTS

JP 10-340700 A 12/1998
JP 2004-209626 A 7/2004
(Continued)

OTHER PUBLICATIONS

Gómez-Pau, Álvaro & Sanahuja, R & Balado, Luz & Figueras, Joan. (2012). Built-In Test of MEMS Capacitive Accelerometers for Field Failures and Aging Degradation, accessed at https://upcommons.upc.edu/bitstrearn/handle/2117/17947/dcis2012.pdf (Year: 2012).*
(Continued)

Primary Examiner — Charles D Garber
Assistant Examiner — Alia Sabur
(74) Attorney, Agent, or Firm — Crowell & Moring LLP

(57) ABSTRACT

For the purpose of shortening the MEMS manufacturing TAT, the MEMS manufacturing method according to the present invention includes a step of extracting the first MEMS with first characteristic in a range approximate to the required characteristic from the plurality of MEMS preliminarily prepared on the main surface of the substrate, and a step of forming a second MEMS having the required characteristic by directly processing the first MEMS.

12 Claims, 31 Drawing Sheets

(52) U.S. Cl.
CPC .. *B81C 99/0065* (2013.01); *B81C 2201/0143* (2013.01); *B81C 2201/0181* (2013.01); *B81C 2203/038* (2013.01); *G01P 15/125* (2013.01)

(56) References Cited

U.S. PATENT DOCUMENTS

| | | | |
|---|---|---|---|
| 7,267,731 | B2 | 9/2007 | Iwasaki |
| 2002/0068370 | A1* | 6/2002 | Dwyer ............... B81C 1/00666 438/14 |
| 2004/0129351 | A1* | 7/2004 | Iwasaki ................. C23C 16/047 148/508 |
| 2006/0131269 | A1 | 6/2006 | Aiba |
| 2010/0105167 | A1 | 4/2010 | Eskridge et al. |
| 2011/0138912 | A1* | 6/2011 | Degawa ............. G01C 19/5733 73/504.12 |
| 2011/0309553 | A1 | 12/2011 | Huff |
| 2012/0273458 | A1* | 11/2012 | Bret ...................... B82Y 10/00 216/39 |

FOREIGN PATENT DOCUMENTS

| | | |
|---|---|---|
| JP | 2004-249457 | 9/2004 |
| JP | 2010-105153 A | 5/2010 |
| JP | 2010-232185 A | 10/2010 |
| JP | 2011-58819 A | 3/2011 |
| JP | 2013-24828 A | 2/2013 |
| JP | 2014-519046 A | 8/2014 |
| JP | 2015-34824 A | 2/2015 |
| WO | WO 02/28766 A2 | 4/2002 |

OTHER PUBLICATIONS

Tanaka, T., Irisawa, T., Fujiwara, M., & Gennai, N. (2006). Micrometer-scale fabrication and assembly using focused ion beam. Thin solid films, 509(1-2), 113-117 (Year: 2006).*
International Search Report (PCT/ISA/210) issued in PCT Application No. PCT/JP2016/058681 dated May 31, 2016 with English translation (four (4) pages).
Japanese-language Written Opinion (PCT/ISA/2371) issued in PCT Application No. PCT/JP2016/058681 dated May 31, 2016 (six (6) pages).
Japanese-language Office Action issued in counterpart Japanese Application No. 2018-505184 dated Mar. 26, 2019 with English translation (17 pages).
Extended European Search Report issued in counterpart European Application No. 16894433.8 dated Sep. 4, 2019 (eight (8) pages).

* cited by examiner

FIG. 6

| 161 | 162 | 163 | | 164 | 165 | 166 | 167 |
|---|---|---|---|---|---|---|---|
| WAFER NUMBER | CHIP NUMBER | CHIP POSITION | | MASS OF MOVABLE SECTION ($10^{-6}$g) | WIDTH OF SUPPORT BEAM ($\mu$m) | REGION WHERE MASS CAN BE ADDED TO MOVABLE SECTION (POSITIONAL RELATION WITH MARK "+") | REGION WHERE SUPPORT BEAM CAN BE CUT (POSITIONAL RELATION WITH MARK "+", ×4) |
| | | X | Y | | | | |
| 1 | 1 | 1 | 1 | 100 | 100 | [X1,Y1]-[X2,Y2] | [x1,y1]-[x2,y2], [x3,y3]-[x4,y4], [x5,y5]-[x6,y6], [x7,y7]-[x8,y8] |
| 1 | 2 | 2 | 1 | 200 | 100 | ... | ... |
| 1 | 3 | 3 | 1 | 300 | 100 | ... | ... |
| 1 | 4 | 4 | 1 | 400 | 100 | ... | ... |
| 1 | 5 | 5 | 1 | 500 | 100 | ... | ... |
| 1 | 6 | 1 | 2 | 100 | 80 | ... | ... |
| 1 | 7 | 2 | 2 | 200 | 80 | ... | ... |
| 1 | 8 | 3 | 2 | 300 | 80 | ... | ... |
| ... | ... | ... | ... | ... | ... | ... | ... |

| PART NAME | PART NUMBER | PART ADDRESS | DIMENSION | | |
|---|---|---|---|---|---|
| | | | X | Y | Z |
| SPRING | k1 | t1,t1 | x1 | y1 | z1 |
| | k2 | t1,t2 | x1 | y2 | z1 |
| | k3 | t1,t3 | x1 | y3 | z1 |
| | k4 | t1,t4 | x1 | y4 | z1 |
| | k5 | t1,t5 | x1 | y5 | z1 |
| | k6 | t1,t6 | x1 | y6 | z1 |
| | k7 | t1,t7 | x1 | y7 | z1 |
| | k8 | t1,t8 | x1 | y8 | z1 |
| | k9 | t1,t9 | x1 | y9 | z1 |

PROCESS FLOW 150

| 151 | 152 | 153 | 154 | 155 | 156 | 157 |
|---|---|---|---|---|---|---|
| PROCESS No | PROCESS NAME | PART NAME | PART NUMBER | LAYOUT LAYER NUMBER | ANGLE | PROCESS RECIPE NUMBER |
| 1 | SUBSTRATE | SUBSTRATE | s | -- | -- | -- |
| 2 | ACQUISITION OF PART | ANCHOR | a2 | -- | -- | -- |
| 3 | CONNECTION OF PART | | | 1 | 0 | 14 |
| 4 | ACQUISITION OF PART | SPRING | k8 | -- | -- | -- |
| 5 | CONNECTION OF PART | | | 2 | 0 | 12 |
| 6 | ACQUISITION OF PART | MASS | m5 | -- | -- | -- |
| 7 | CONNECTION OF PART | | | 3 | 0 | 26 |
| 8 | PROCESSING OF STRUCTURE | -- | | 4 | -- | 18 |

FIG. 20

PROCESS RECIPE NUMBER 12

| COORDINATES ON STAGE AT PART CENTER | X | $X_k$ |
|---|---|---|
| | Y | $Y_k$ |
| OFFSET FROM SUBSTRATE SURFACE | Z | $z1$(SPRING THICKNESS) $+z3$(ANCHOR THICKNESS) |
| FILM FORMATION/ETCHING | | $z1$ |
| PROCESSED MATERIAL | | C(CARBON) |
| PROCESSED THICKNESS | | 100nm |
| LAYOUT OF PROCESS POSITION | | 2 |
| BEAM CURRENT | | 100nA |
| SCAN MODE | | VECTOR |
| BEAM CONDITIONS | | |
| | | |
| | | |

FIG. 22

PROCESS RECIPE NUMBER 18

| COORDINATES ON STAGE AT PART CENTER | X | – |
| | Y | – |
| OFFSET FROM SUBSTRATE SURFACE | Z | – |
| FILM FORMATION/ETCHING | | ETCHING |
| PROCESSED MATERIAL | | Si(SILICON) |
| PROCESSED THICKNESS | | z1 |
| LAYOUT OF PROCESS POSITION | | 4 |
| BEAM CURRENT | | 50nA |
| SCAN MODE | | VECTOR |
| BEAM CONDITIONS | | |
| | | |
| | | |

MEMS MANUFACTURING METHOD AND MEMS MANUFACTURING APPARATUS

TECHNICAL FIELD

The present invention relates to a MEMS (Micro Electro Mechanical Systems) manufacturing method and a MEMS manufacturing apparatus.

BACKGROUND ART

Japanese Unexamined Patent Application Publication No. 2004-209626 (Patent Literature 1) has disclosed background art of the present technical field. The publication discloses the method of manufacturing the three-dimensional microstructure. The manufacturing method is implemented by producing a trial structure through temporary processing based on the designed three-dimensional configuration data of the three-dimensional structure while having processing conditions controlled so that the trial structure configuration is compared with the designed configuration. The main processing is performed while correcting the processing condition for the purpose of compensating for the difference.

CITATION LIST

Patent Literature

Patent Literature 1: Japanese Unexamined Patent Application Publication No. 2004-209626

SUMMARY OF INVENTION

Technical Problem

The micromachining technique using the FIB (Focused Ion Beam) device capable of shortening TAT (Turn Around Time) has been regarded as a promising approach to actualize MEMS manufacturing. In order to obtain the desired device characteristics of the MEMS manufactured using the FIB device, it may be necessary to execute the additional processing to the MEMS manufactured by the FIB device.

In the above-described case, the operator operates the FIB device to execute the additional processing while confirming the MEMS shape. Alternatively, as disclosed in Patent Literature 1, the trial structure is preliminarily made so that the shape of the trial structure is compared with the designed shape. The main processing is then executed while correcting the processing condition so as to compensate for the difference. This may cause the problem that the MEMS manufacturing TAT cannot be shortened in spite of the use of the FIB device.

Solution to Problem

In order to solve the above-described problem, the MEMS manufacturing method according to the present invention includes a step of extracting a first MEMS having a first characteristic in a range approximate to a required characteristic from a plurality of MEMS preliminarily prepared on a main surface of a substrate, and a step of forming a second MEMS having the required characteristic by directly processing the first MEMS.

The MEMS manufacturing apparatus according to the present invention includes a sample stage for holding a first MEMS, an irradiation optical system for irradiating the first MEMS on the sample stage with an ion beam, and a database in association with a characteristic of a second MEMS with a required characteristic. Based on data stored in the database, the first MEMS on the sample stage is directly processed to form the second MEMS.

Advantageous Effects of Invention

The present invention is capable of shortening the MEMS manufacturing TAT.

The above-described problem, structure, and effect will be clarified by explanations of the embodiments as described below.

BRIEF DESCRIPTION OF DRAWINGS

FIG. 6 is a view showing an exemplary data structure stored in a database according to the first embodiment.

FIG. 14 is a view showing data of part numbers, part addresses, and part specifications of the spring member, which are stored in a part database according to the second embodiment.

FIG. 15 is a view showing an exemplary process flow for the acceleration sensor with desired structure according to the second embodiment.

FIG. 20 is a view showing an example of a process recipe for the spring member according to the second embodiment.

FIG. 22 is a view showing an example of the process recipe for processing the acceleration sensor with starting structure according to the second embodiment.

DESCRIPTION OF EMBODIMENTS

Figure 1:
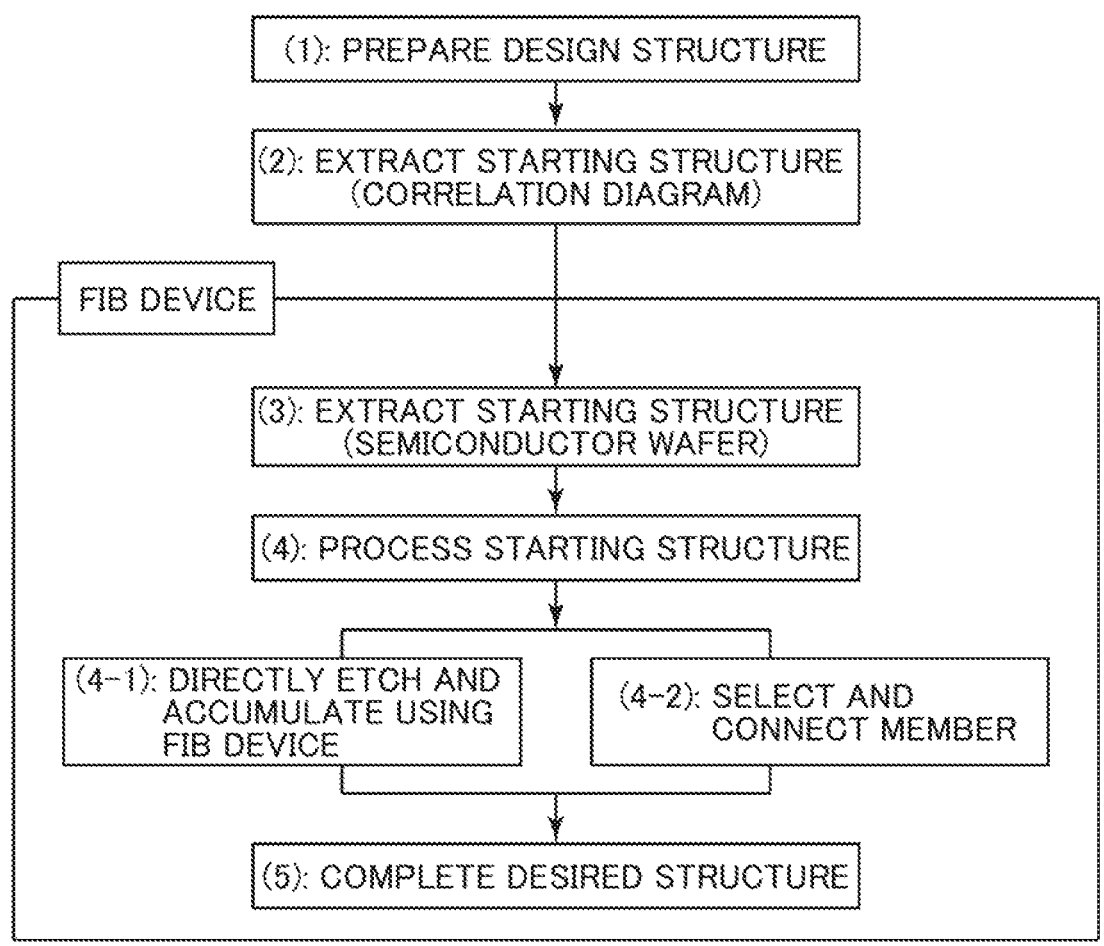
FIG. 1 is a flowchart explaining a MEMS manufacturing method according to a first embodiment.

Embodiments according to the present invention will be described in detail referring to the drawings. In the drawings corresponding to the following embodiments, the same members will be designated with the same codes, and repetitive explanations thereof, thus will be omitted.

In the following embodiments, the explanation will be made while being divided into a plurality of sections, or in the respective embodiments as needed for convenience of explanation. Unless otherwise clarified, the explanations are correlated with one another. For example, one of the embodiments maybe a modified example, application example, a detailed description, a supplementary description of a part or all of another embodiment. In the following embodiments, unless otherwise clarified, or limited to the specific value in principle, the number related to elements (including the number of elements, numerical value, amount, and range) is not limited to the specific value. It is possible to set the number to be more or less than the specific value in non-restrictive manners.

In the following embodiments, except the case where the components (including process steps) are specified or considered as essential in principle, they are not necessarily essential. Likewise, unless otherwise clarified or considered as being not applicable in principle, in the following embodiments, when making reference to the shape or positional relationship of the components, the component with shape similar to the referred shape may be contained. This applies to the numbers described herein (including the number of components, numerical value, amount, range and the like).

The embodiments will be described in detail referring to the drawings. Each member with the same function will be designated with the same or relevant code in all the drawings, and repetitive explanations, thus, will be omitted. In the case of a plurality of similar members (parts), an arbitrary code may be added to the general code for the purpose of indicating the individual or specific part. Basically, in the following embodiments, unless otherwise required, the explanation of the same or similar part will be omitted.

Each size of the parts shown in the respective sectional views and plan views does not necessarily correspond to the size of the actual device. There may be the case where the specific part is relatively enlarged so as to make the drawing comprehensible. Even in the case where the sectional view and the plan view are correlated, the specific section may be relatively enlarged so as to make the drawing comprehensible.

First Embodiment

A MEMS manufacturing method according to a first embodiment will be described referring to FIGS. 1 to 9. The first embodiment may be implemented using the FIB device and an information processor as the device for controlling the FIB device.

Figure 2:
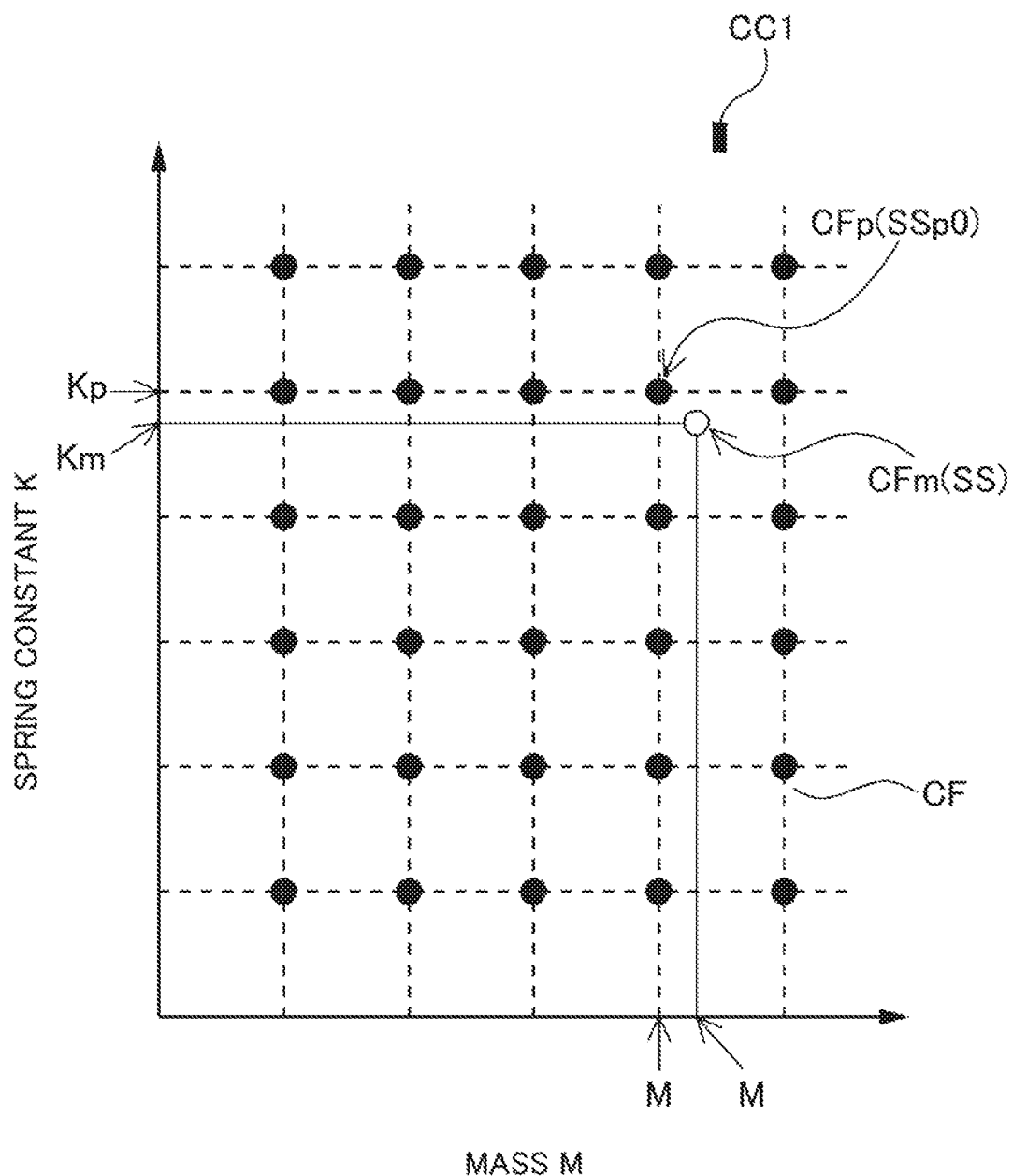
FIG. 2 is a correlation diagram between structure/physical parameters and device characteristics of the designed structure of the acceleration sensor according to the first embodiment.
Figure 3:
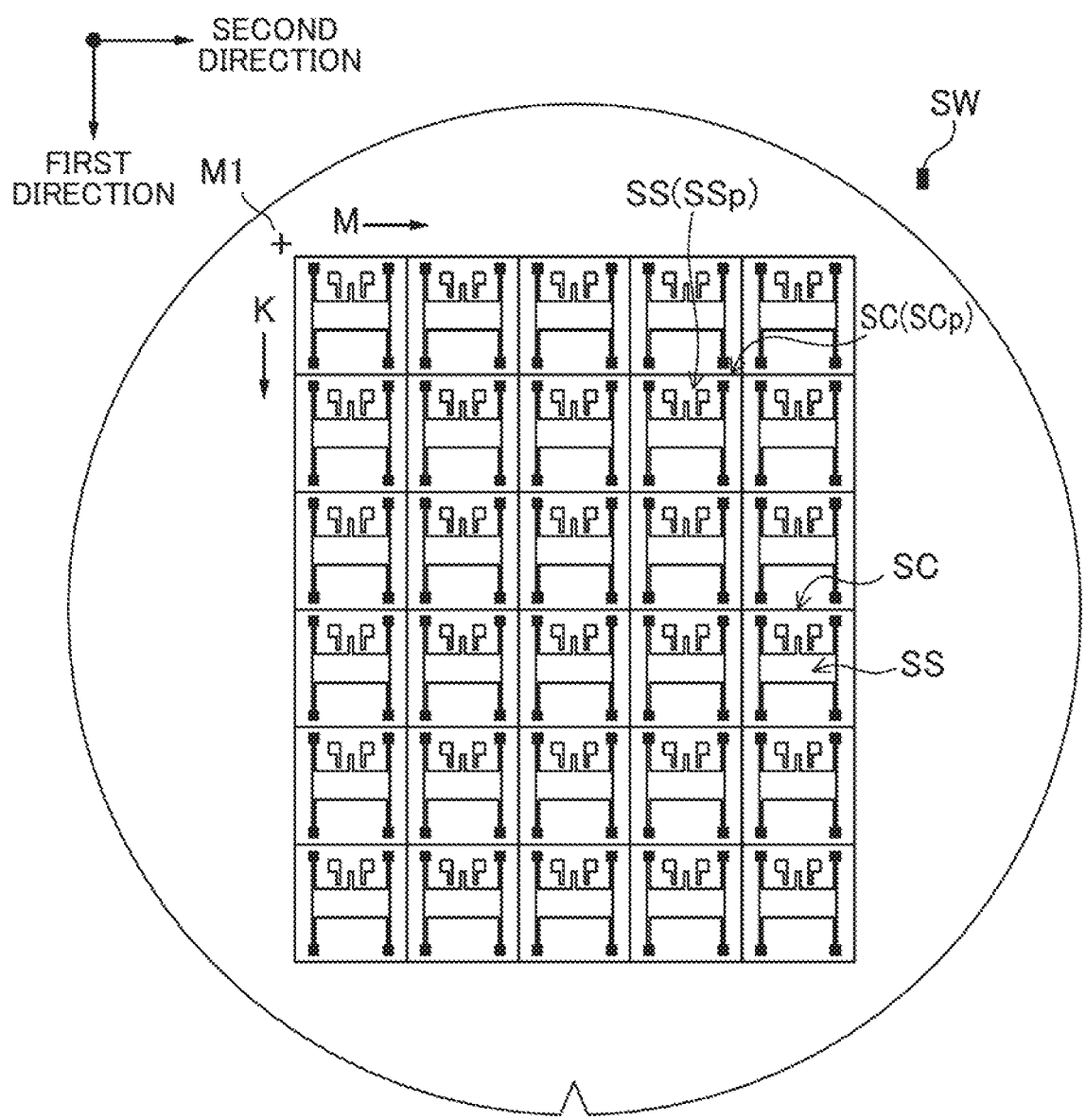
FIG. 3 is a plan view of a semiconductor wafer for manufacturing acceleration sensors according to the first embodiment.
Figure 4:
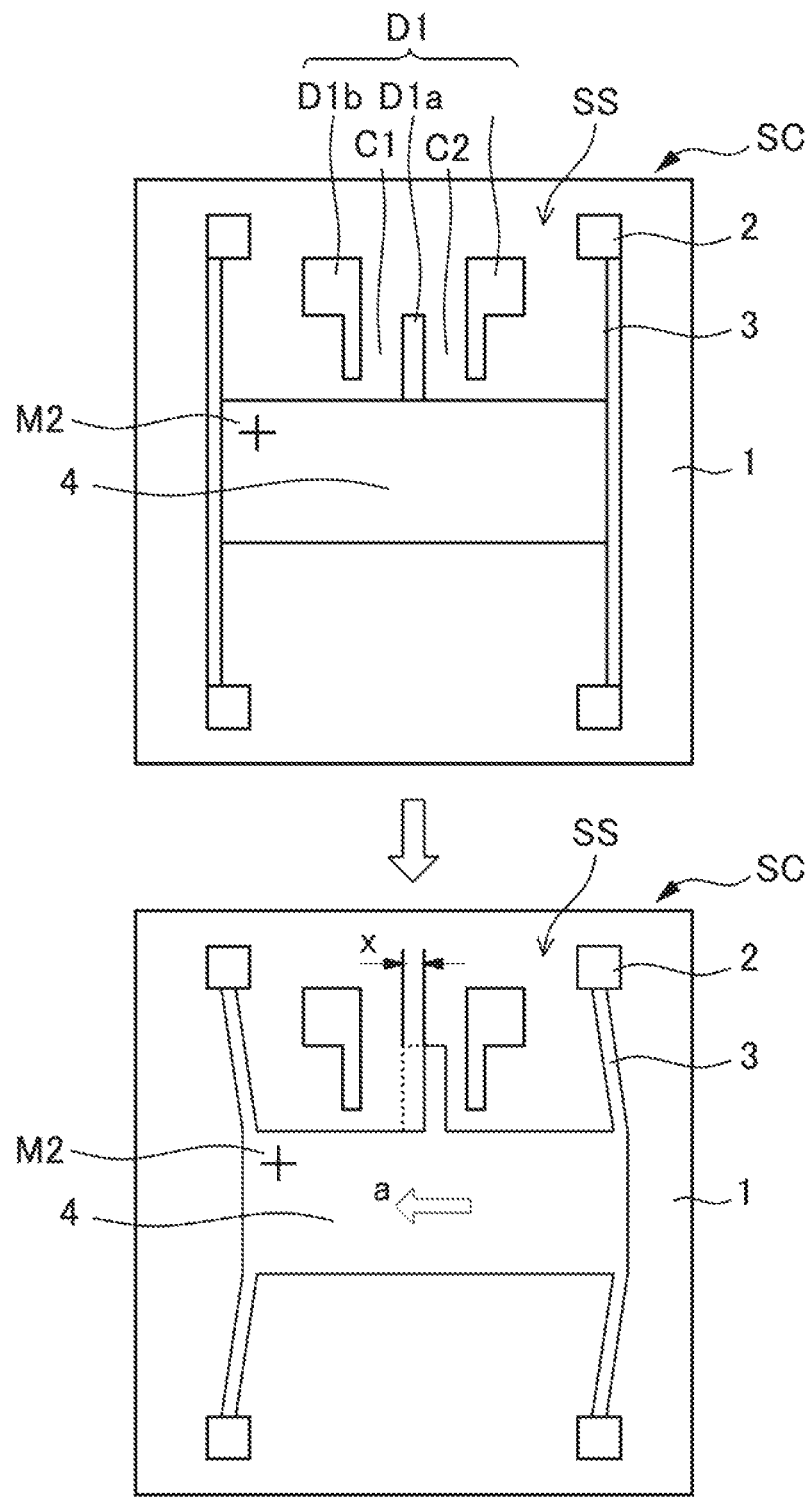
FIG. 4 is a plan view of an exemplary acceleration sensor according to the first embodiment.
Figure 5:
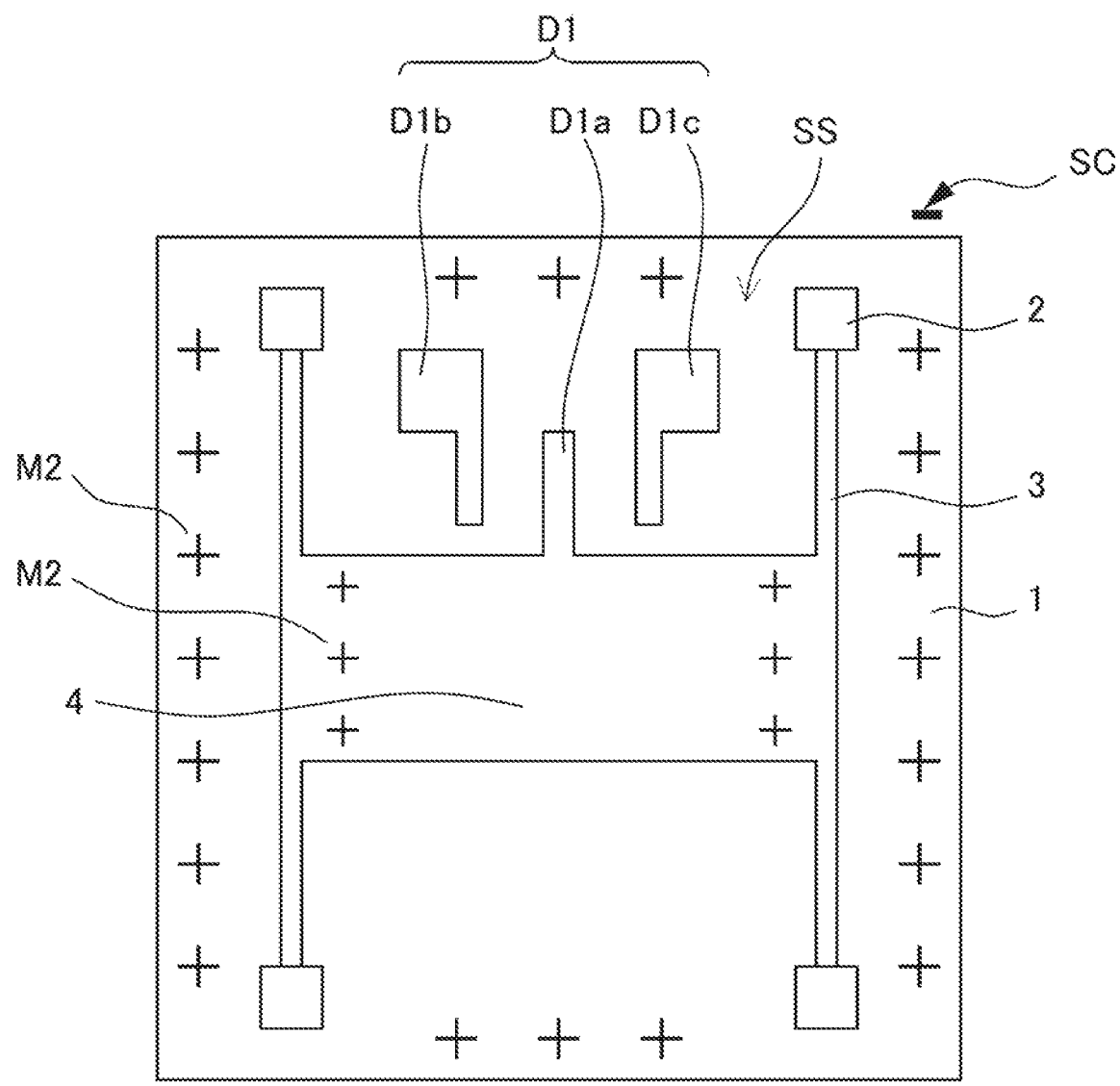
FIG. 5 is a plan view of another exemplary acceleration sensor according to the first embodiment.
Figure 7:
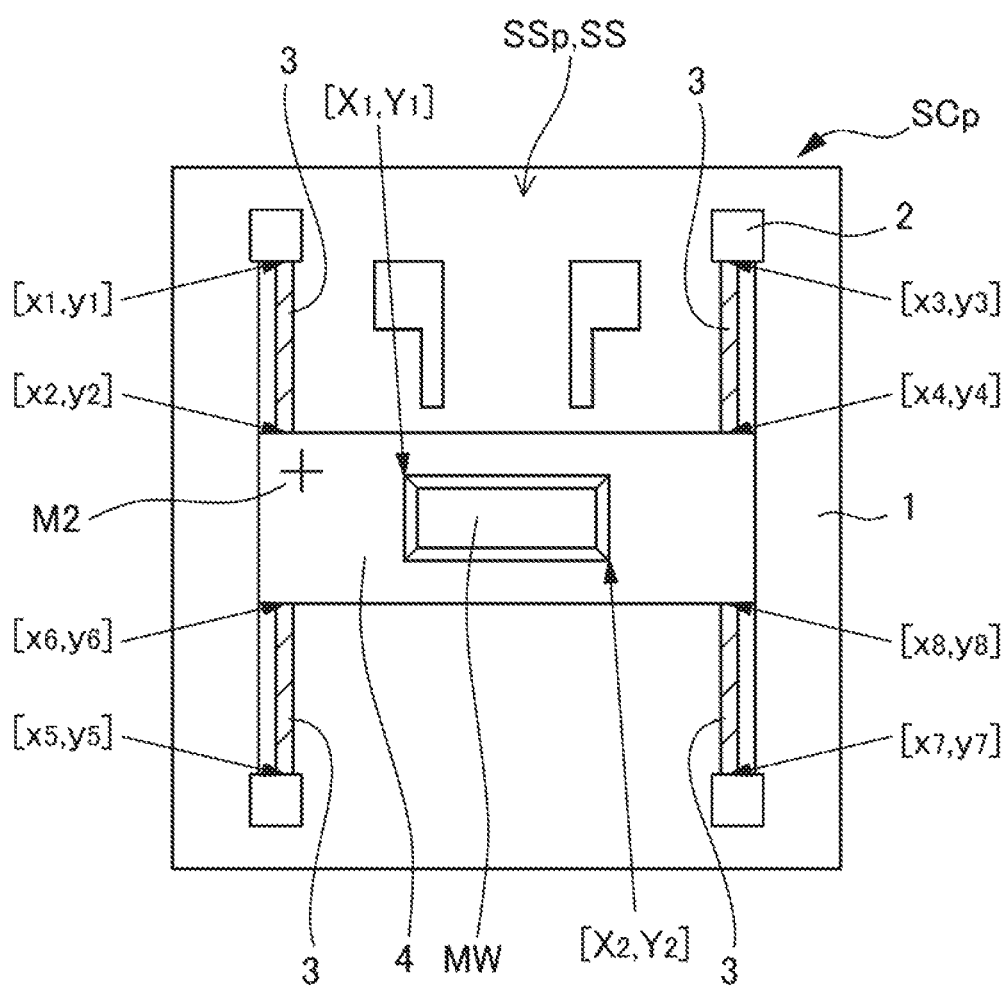
FIG. 7 is a plan view of an exemplary acceleration sensor after execution of the additional processing according to the first embodiment.
Figure 8:
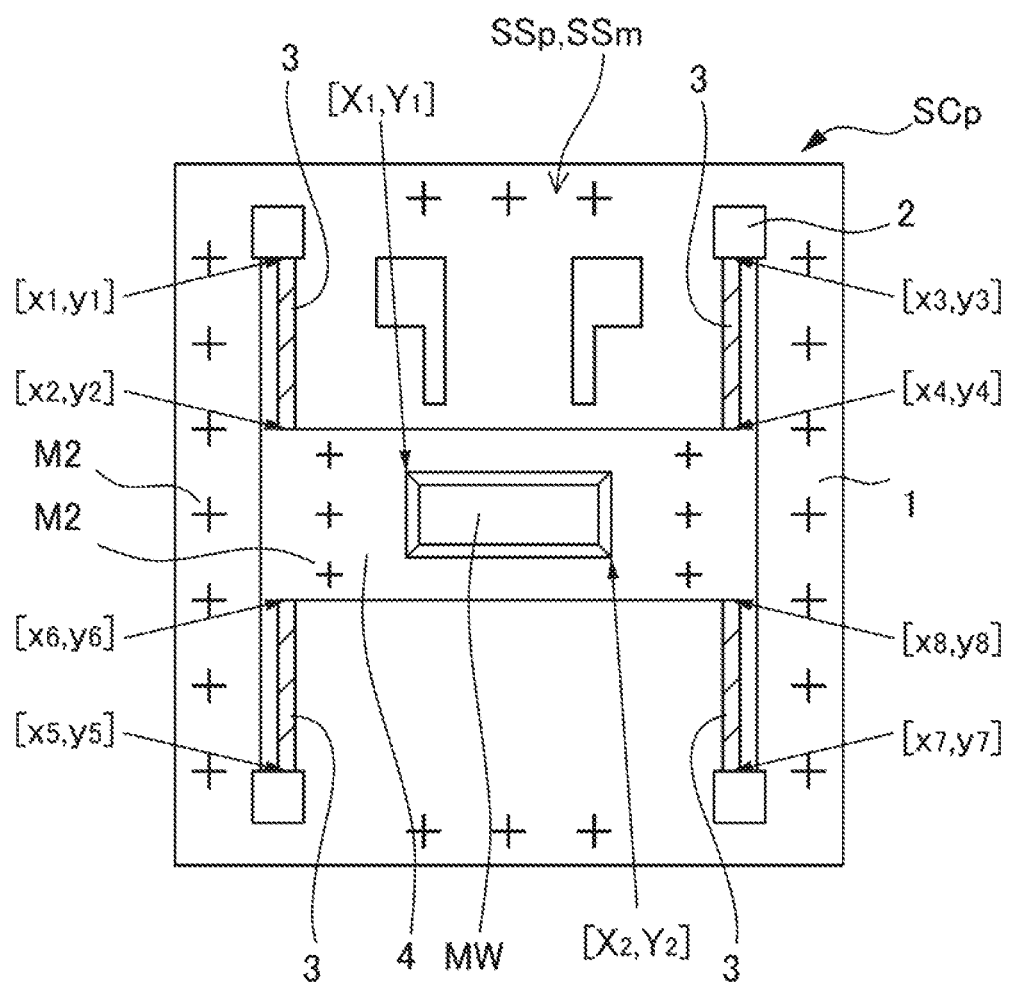
FIG. 8 is a plan view of another exemplary acceleration sensor after execution of the additional processing according to the first embodiment.
Figure 9:
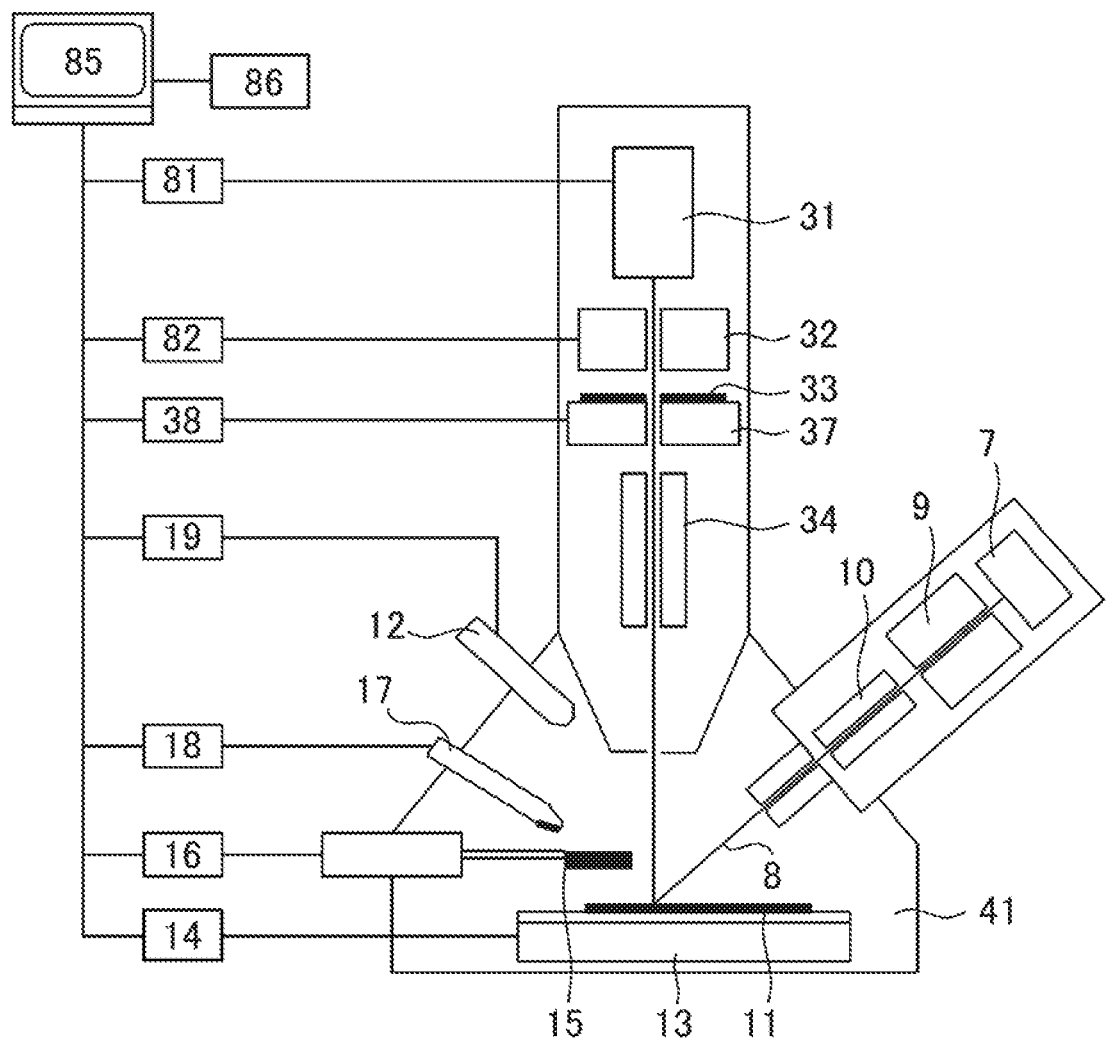
FIG. 9 is a view schematically showing a MEMS manufacturing apparatus according to the first embodiment.

FIG. 1 is a flowchart explaining the MEMS manufacturing method according to the first embodiment. FIG. 2 is a correlation diagram between structure parameters and physical parameters (hereinafter referred to as "structure/physical parameters") and device characteristics of the designed structure of the acceleration sensor according to the first embodiment. FIG. 3 is a plan view of a semiconductor wafer for manufacturing the acceleration sensors according to the first embodiment. FIG. 4 is a plan view of an exemplary acceleration sensor according to the first embodiment, and FIG. 5 is a view of another exemplary acceleration sensor according to the first embodiment. FIG. 6 is a view showing an exemplary data structure stored in a database according to the first embodiment. FIG. 7 is a plan view of an exemplary acceleration sensor after execution of the additional processing according to the first embodiment, and FIG. 8 is a plan view of another exemplary acceleration sensor after execution of the additional processing according to the first embodiment. FIG. 9 is a view schematically showing the MEMS manufacturing apparatus according to the first embodiment.

In the first embodiment, the acceleration sensor is exemplified as the MEMS. However, it is possible to employ a gyroscope, a microphone, a pressure sensor or the like in non-restrictive manners. The above-described MEMS may be generally categorized into the bulk MEMS manufactured by processing the substrate, and the surface MEMS manufactured by processing the film accumulated on the substrate surface. The MEMS of arbitrary type is usable.

The MEMS manufacturing method according to the first embodiment will be described referring to the flowchart as shown in FIG. 1.

(1) Preparation for Design Structure

The information processor prepares a correlation diagram CC1 between the structure/physical parameters and the device characteristics with respect to the designed structure of the acceleration sensor as shown in FIG. 2.

In the case where the structure/physical parameters are required for obtaining the device characteristic of the desired acceleration sensor, for example, natural frequency, the information processor selects a spring constant K of a support beam, and a mass M of a movable section of the acceleration sensor, based on which the natural frequency CF is calculated to make the correlation diagram CC1 as shown in FIG. 2.

Each of a plurality of dots shown in FIG. 2 represents the natural frequency CF preliminarily calculated using the spring constant K of the support beam and the mass M of the movable section.

In this case, the spring constant K of the support beam and the mass M of the movable section are selected as the structure/physical parameters. However, the parameters are not limited to those described above. For example, it is possible to select the dimension (thickness or width), density, hardness, material constant, or Young's modulus of the component constituting the acceleration sensor. The number of the parameters is not necessarily limited to two, but may be set to three or more.

(2) Extraction of Starting Structure (Correlation Diagram)

The information processor selects a natural frequency CFp of the design specification approximate to the natural frequency CFm of the required specification from the correlation diagram CC1 as shown in FIG. 2. In this case, it is possible to select one or more values of the natural frequency CFp of the design specification. This embodiment exemplifies selection of the single natural frequency CFp of the design specification approximate to the natural frequency CFm of the required specification. It is preferable to select the natural frequency CFp of the design specification, which is the most approximate to the natural frequency CFm of the required specification among those therearound.

In reference to the selected natural frequency CFp of design specification, the information processor determines the spring constant Kp of the support beam and the mass Mp of the movable section, from which the selected natural frequency CFp can be derived. Referring to the correlation diagram CC1 as shown in FIG. 2, the information processor is capable of selecting the acceleration sensor SSpO with structure (hereinafter referred to as "starting structure") having the natural frequency CFp of design specification approximate to the acceleration sensor SSm with structure (hereinafter referred to as "desired structure") having the natural frequency CFm of required specification.

(3) Extraction of Starting Structure (Semiconductor Wafer)

<Step 1: Preparation of Semiconductor Wafer>

The semiconductor wafer SW as shown in FIG. 3 is prepared. The semiconductor wafer SW has a plurality of semiconductor chips SC which are partitioned in a matrix. Each of the semiconductor chips has the preliminarily formed acceleration sensor SS. Those acceleration sensors SS may be made in non-restrictive manners, for example, by the FIB device to be described below.

The semiconductor wafer SW includes a mark M1 for positional identification marked in the region where the semiconductor chips SC are not formed so as to obtain the positional information of the semiconductor chips SC partitioned in a matrix. Positional information of the respective semiconductor chips SC is managed in reference to the mark M1. In the first embodiment, the coordinate [row 1, column 1] is selected as the positional information of the semiconductor chip SC that is the most approximate to the mark M1. The selected position is set as the address starting point.

The semiconductor chips SC formed on the semiconductor wafer SW correspond to the correlation diagram CC1 as shown in FIG. 2. Specifically, values of the spring constant K of the support beam and the mass M of the movable section of each of the acceleration sensors SS formed on the semiconductor chips SC are different from one another. For example, in the case where the spring constant K of the support beam constituting the acceleration sensor SS is selected as the element corresponding to the row (first direction), the acceleration sensors SS are arranged so that values of the spring constant K become smaller sequentially from the row 1 toward the row 6. Likewise, in the case where the mass M of the movable section constituting the acceleration sensor SS is selected as the element corresponding to the column (second direction), the acceleration sensors SS are arranged so that values of the mass M become larger sequentially from the column 1 toward the column 5.

In the first embodiment, a plurality of semiconductor chips SC each having different spring constant K of the support beam, and different mass M of the movable section are formed on the semiconductor wafer SW so as to completely correspond to the correlation diagram CC1 as shown in FIG. 2. The present invention is not limited to the example as described above. It is possible to form the semiconductor chips SC more than those of design specification as indicated by the correlation diagram CC1. The semiconductor chips SC each with the same structure/physical parameters may be formed on the semiconductor wafer SW.

The structure of the acceleration sensor SS will be described referring to FIG. 4.

The acceleration sensor SS includes a fixed section 2 supportively fixed to a support substrate 1 via an insulation layer, a support beam 3 for supporting a movable section 4 (described later) at the fixed section 2, the movable section 4 which is suspended with the support beams 3, and displaced while following up the applied acceleration, and a detection section D1 for detecting the displacement of the movable section 4.

The detection section D1 includes movable electrodes D1a, and fixed electrodes D1b, D1c, in a parallel plate-like arrangement, while constituting electrostatic capacities C1 and C2, respectively. The detection section D1 is configured to execute differential detections. Upon displacement of the movable section 4, the differential detection may be executed based on the difference between a decreasing capacitance value of the electrostatic capacity C1 and an increasing capacitance value of the electrostatic capacity C2 (ΔC=C2−C1).

The electric circuit executes the differential detection of the electrostatic capacity change caused by displacement of the movable section 4. This makes it possible to output the applied acceleration as the voltage signal.

The natural frequency $f_0$ of the acceleration sensor SS may be expressed by the following formula (1).

[Formula 1]

$$f_0 \propto \sqrt{\frac{K}{M}} \quad \text{Formula (1)}$$

$f_0$: natural frequency of acceleration sensor SS,
M: mass of the movable section 4,
K: spring constant of the support beam 3 which supports the movable section 4

The desired natural frequency $f_0$ of the acceleration sensor SS may be obtained by setting the spring constant K of the support beam 3 and the mass M of the movable section 4 of the acceleration sensor SS.

A Mark M2 is formed on each of the respective semiconductor chips SC each having the acceleration sensor SS. The position information of the mark M2 is under management. For example, it is possible to form the mark M2 on the movable section 4 of the acceleration sensor SS as shown in FIG. 4.

Referring to FIG. 5, the plurality of marks M2 may be formed on the respective semiconductor chips SC each having the acceleration sensor SS. The marks M2 may be formed on the insulation layer applied onto the main surface of the support substrate 1, and on the movable section 4 of the acceleration sensor SS. In the first embodiment, the support substrate 1 corresponds to the semiconductor wafer SW.

For example, the marks M1, M2 are formed through the etching process of photolithography technique after forming the acceleration sensor SS on the semiconductor wafer SW for each of the semiconductor chips. It is also possible to form those marks directly on the semiconductor chip SC or the acceleration sensor SS using the FIB device.

<Step 2: Extraction of Acceleration Sensor with Starting Structure>

As described above, the semiconductor wafer SW has the semiconductor chips SC which are partitioned in a matrix. Each of the acceleration sensors SS formed on the respective semiconductor chips SC has values of both the spring constant K of the support beam and the mass M of the movable section which are different from those of the other sensors.

Based on the spring constant Kp of the support beam and the mass Mp of the movable section of the acceleration sensor SSpO with starting structure that is extracted in the process step of "(2) Extraction of starting structure (Correlation diagram)", the FIB device extracts the semiconductor chip SCp having the acceleration sensor SSp with starting structure from among the semiconductor chips SC formed on the semiconductor wafer SW.

If the semiconductor chips SC each having the same structure/physical parameters are formed on the semiconductor wafer SW, the information processor is allowed to extract one of the semiconductor chips SC each having the same structure/physical parameters in accordance with the required specification, and to set the extracted one as the semiconductor chip SCp with starting structure. In this case, the information processor is allowed to extract the semiconductor chip SCp without using the correlation diagram CC1.

(4) Processing of Starting Structure

There is an error in value between the spring constant Kp of the support beam of the acceleration sensor SSp with starting structure extracted in the process step of "(3) Extraction of starting structure (Semiconductor wafer)" and the spring constant Km of the support beam of the acceleration sensor SSM with desired structure. There is also an error in value between the mass Mp of the movable section of the extracted acceleration sensor SSp with starting structure and the mass Mm of the movable section of the acceleration sensor SSm with desired structure. The acceleration sensor SSp with starting structure cannot provide the natural frequency CFm of required specification.

Then the acceleration sensor SSp with starting structure is directly processed (directly shaped) by the FIB device so as to form the acceleration sensor SSm with desired structure. Specifically, the FIB device cuts the support beam to decrease the spring constant Kp, or adds the member to the movable section to increase the mass Mp. This makes it possible to form the acceleration sensor SSm with desired structure.

The acceleration sensor SSp with starting structure may be processed in accordance with the following procedures. An example of the procedures for processing the acceleration sensor SSp with starting structure will be described referring to FIGS. 6 and 7.

The FIB device to be described later is employed for processing the acceleration sensor SSp with starting structure. A database 86 of the FIB device preliminarily stores various data relevant to the semiconductor wafer SW.

For example, as shown in FIG. 6, the database 86 stores data of a wafer number 161, a chip number 162, a chip position (X, Y) 163, a mass 164 of movable section, a width 165 of support beam, an area 166 that allows addition of mass to the movable section (positional relation with mark "+"), and an area 167 that allows cutting of the support beam (positional relation with mark "+").

The database 86 provides data of the chip number 162 and the chip position (X, Y) 163 of the semiconductor chip SCp having the acceleration sensor SSp with starting structure in reference to the address of the acceleration sensor SSpO with starting structure extracted in the process step of "(2) Extraction of starting structure (Correlation diagram)".

The database provides data of the area 166 that allows addition of mass to the movable section ($[X_1, Y_1]$-$[X_2, Y_2]$), and the area 167 that allows cutting of the support beam ($[x_1,y_1]$-$[x_2, y_2]$, $[x_3, y_3]$-$[x_4, y_4]$, $[x_5, y_5]$-$[x_6, y_6]$, $[x_7, y_7]$-$[x_8, y_8]$) in reference to the mark M2 on the acceleration sensor SSp with starting structure.

Based on the chip number and the chip position (X,Y) of the semiconductor chip SCp having the acceleration sensor SSp with starting structure, which have been obtained from the database 86, the semiconductor wafer SW is moved so that the acceleration sensor SSp with starting structure is disposed at the processing position of the FIB device.

The position of the semiconductor chip SCp may be easily located in reference to the mark M1 on the semiconductor wafer SW. The processing position of the acceleration sensor SSp with starting structure maybe easily located in reference to the mark M2 on the semiconductor chip SCp.

As FIG. 7 shows, based on the area that allows cutting of the support beam ($[x_1, y_1]$-$[x_2, y_2]$, $[x_3, y_3]$-$[x_4, y_4]$, $[x_5, y_5]$-$[x_6, y_6]$, $[x_7, y_7]$-$[x_8, y_8]$), the FIB device cuts the support beam 3 of the acceleration sensor SSp with starting structure. Referring to FIG. 7, the hatching region indicates the cut region. Based on the area that allows addition of mass to the movable section ($[X_1, Y_1]$-$[X_2, Y_2]$), the FIB device disposes a member MW on the movable section 4 of the acceleration sensor SSp with starting structure.

The cut amount of the support beam 3 may be easily derived from the difference between the spring constant Kp of the support beam 3 of the acceleration sensor SSp with starting structure and the spring constant Km of the support beam 3 of the acceleration sensor SSm with desired structure. Likewise, the mass of the member MW may be easily derived from the difference between the mass Mp of the movable section 4 of the acceleration sensor SSp with starting structure and the mass Mm of the movable section 4 of the acceleration sensor SSm with desired structure.

This makes it possible to produce the acceleration sensor SSm with desired structure.

The example as described above is designed to process the acceleration sensor SSp with starting structure, having the single semiconductor chip SCp with the single mark M2.

As FIG. 8 shows, it is possible to process the acceleration sensor SSp having the single semiconductor chip SCp with a plurality of marks M2. In this case, the cutting position of the support beam 3 and the position on which the member MW is disposed on the movable section 4 may be located more accurately. This makes it possible to form the acceleration sensor SSm with desired structure with high accuracy.

For example, the FIB device as shown in FIG. 9 is employed for processing the acceleration sensor SSp with starting structure.

The FIB device includes a vacuum chamber 41 in which an ion beam irradiation system is disposed. The ion beam irradiation system includes an ion source 31 for discharging ions, a condenser lens 32, a beam limit aperture 33, an ion beam scanning deflector 34, and an aperture rotating mechanism 37. The ion discharged from the ion source 31 contains, for example, gallium ion, xenon ion, and the like.

Also there is provided an electron beam irradiation system including an electron gun 7, an electron lens 9 for focusing an electron beam 8 irradiated from the electron gun 7, and an electron beam scanning deflector 10. Further there are provided a sample 11, a secondary particle detector 12, a sample stage 13, a probe (manipulator) 15, and a gas source 17 configured to introduce source gas (deposition gas) upon film formation, or gas for facilitating etching when cutting into the vacuum chamber 41. The sample 11 represents the semiconductor wafer SW on which the plurality of acceleration sensors SS are formed as shown in FIG. 2.

As devices for controlling the FIB device, there are provided a sample stage control unit 14, a manipulator control unit 16, a gas source control unit 18, a secondary particle detector control unit 19, an aperture rotation control mechanism 38, an ion source control unit 81, a lens control unit 82, a calculation process unit 85, and a storage unit for storing the database 86.

The sample stage 13 includes a linear movement mechanism for movement in two orthogonal directions on the sample placement surface, a linear movement mechanism for movement in the direction vertical to the sample placement surface, a rotation mechanism on a sample placement surface, and an inclination mechanism with an inclination axis on the sample placement surface. Those mechanisms are controlled by the sample stage control unit 14 in response to the instruction from the calculation process unit 85.

The calculation process unit 85 includes an information input unit that allows the user of the device to input necessary information, and a display for displaying images generated based on the detection signal of the secondary particle detector 12, and information input through the information input unit.

The database 86 stores various data relevant to the sample 11, for example, the data about the acceleration sensors SS formed on the semiconductor wafer as shown in FIG. 6. The database 86 stores various data such as the process flow and the process recipe upon processing of the acceleration sensor SSp with starting structure. Upon formation of the acceleration sensor SSm with desired structure by processing the acceleration sensor SSp with starting structure, the required information is output from the database 86.

The FIB device is configured to allow the condenser lens 32 and the objective lens to focus the ion discharged from the ion source 31 on the sample 11. The focus conditions maybe input into the calculation process unit 85 so as to be set. The beam diameter irradiated onto the sample 11 is determined in accordance with the image formed on the sample 11 to which light is supplied from the ion source 31, and the aberration caused by the lens. The aberration caused by the lens increases as the beam limit aperture 33 enlarges the opening, thus increasing the beam diameter.

(4-1) Direct Etching and Accumulation using FIB Device

When cutting the support beam of the acceleration sensor SSp with starting structure, the FIB device is allowed to irradiate the ion beam to the support beam for direct etching so that the support beam is processed to have the desired dimension. When disposing the member on the movable section, the FIB device is allowed to irradiate the ion beam to the movable section, and accumulate the film on the movable section for direct formation of the member.

(4-2) Selection and Connection of Member

Upon placement of the member on the movable section, the FIB device is allowed to use the probe (manipulator) 15 for selection of the member cut out from the sample 11, or the member preliminarily prepared on the storage place so that the selected member is transferred to the movable section, and the member is bonded onto the movable section.

(5) Completion of Desired Structure

Execution of the process steps from "(1) Preparation of design structure" to "(4) Processing of starting structure" completes the acceleration sensor SSm with desired structure.

The process steps at least from "(3) Extraction of starting structure (Semiconductor wafer)" to "(5) Completion of desired structure" may be executed successively in the same FIB device as the series of processing. Specifically, the following process steps may be executed successively in the same FIB device, that is, the process step of forming the plurality of acceleration sensors SS on the semiconductor wafer SW, the process step of extracting the acceleration sensor SSp with starting structure from the plurality of acceleration sensors SS formed on the semiconductor wafer SW based on the correlation diagram, and the process step of forming the acceleration sensor SSm with desired structure by processing the acceleration sensor SSp with starting structure.

<Device Design Method>

Figure 10:
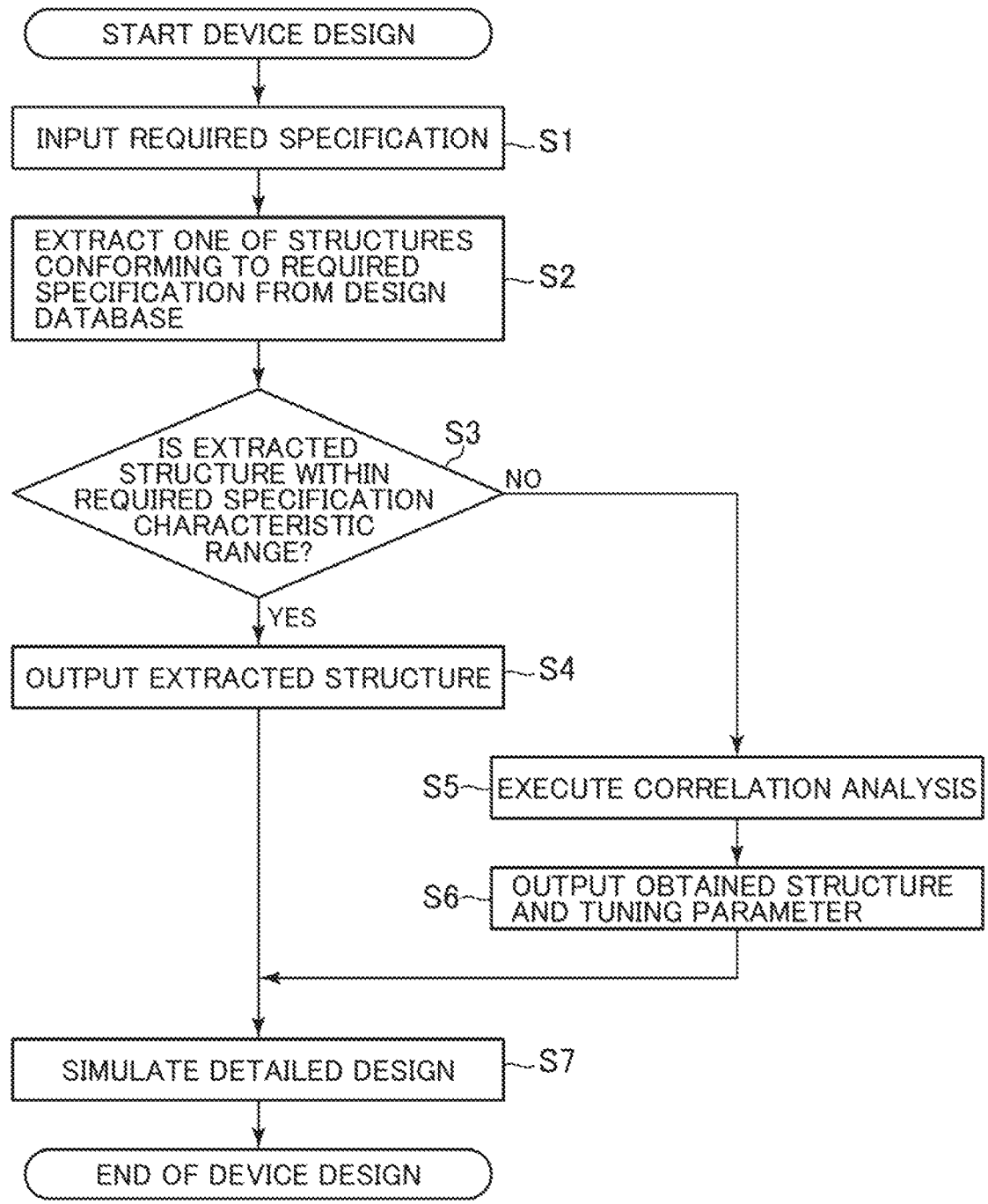
FIG. 10 is a view showing a first example of a procedure for a device design method according to the first embodiment.
Figure 11:
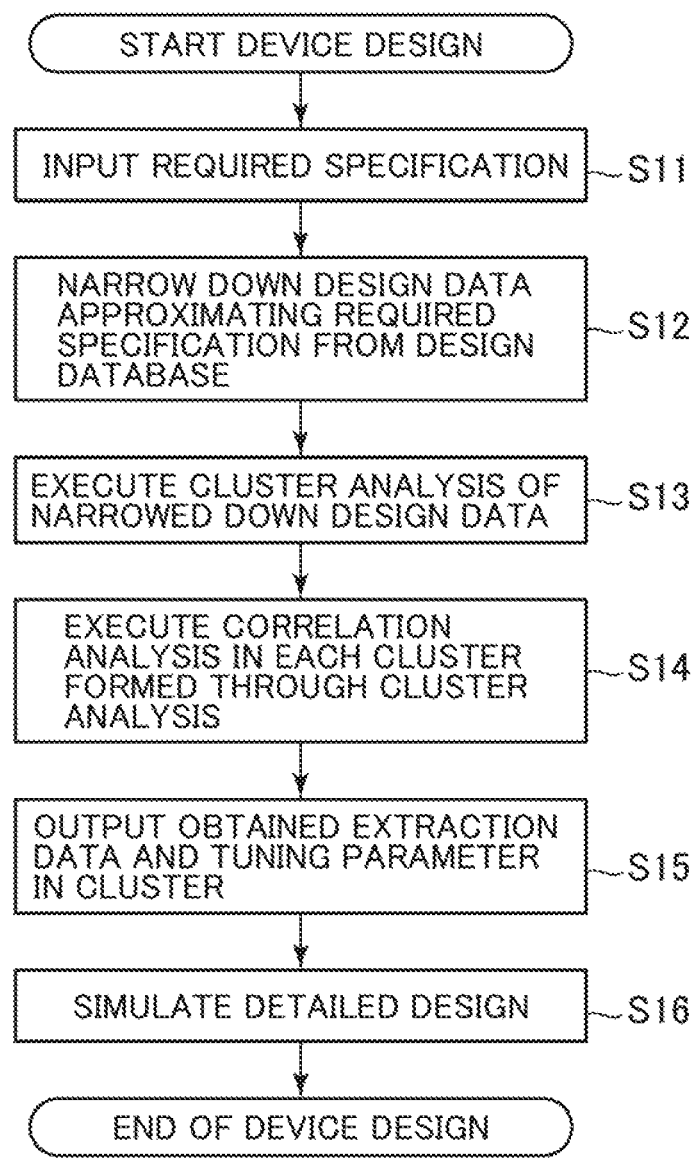
FIG. 11 is a view showing a second example of the procedure for the device design method according to the first embodiment.

The MEMS device design method according to the first embodiment will be described referring to FIGS. 10 and 11. FIG. 10 represents a first example of the procedure for the device design method. FIG. 11 represents a second example of the procedure for the device design method. Those device design methods will be implemented by a device design system.

<<FIRST EXAMPLE>>

In the first example of the procedure for the device design method according to the first embodiment, as FIG. 10 shows, the design database is preliminarily constructed before starting the device design. The design database stores data of device structure in association with characteristics. The design database is constructed by preliminarily executing simulation which covers the entire manufacturable range for the purpose of preventing the solution from being biased to the designer's experience.

After starting the device design, the required specification is input (step S1). The required specification includes characteristics and the characteristic range. Step S1 is executed through an input/output section of the device design system.

One of the structures conforming to the required specification is extracted from the preliminarily constructed design database (step S2). Step S2 is executed by an extraction section of the device design system.

Then it is judged whether or not the extracted structure is within the characteristic range of the required specification (step S3). Step S3 is executed by a judgement section of the device design system.

If it is judged that the extracted structure is within the characteristic range in step S3, the extracted structure is output (step S4). Step S4 is executed through the input/output section of the device design system.

Meanwhile, if it is judged that the extracted structure deviates from the characteristic range, a correlation analysis is executed (step S5). In the correlation analysis, the correlation between the extracted structure and the characteristic is analyzed for extraction of a tuning parameter. Step S5 is executed by an analysis section of the device design system.

The structure and the tuning parameter obtained as a result of the correlation analysis are output (step S6). Step S6 is executed through the input/output section of the device design system.

Execution of the above-described process steps completes the device design method using the design database formed by preliminarily executing simulation that covers the entire manufacturable range. For example, in response to the operation for inputting the required specification by the designer in step S1, the subsequent steps S2 to S6 are automatically executed by the above-described device design system.

The structure output in step S4 is simulated with respect to the detailed design (step S7). The structure output in step S6 is adjusted with the tuning parameter, and the adjusted structure is simulated with respect to the detailed design (step S7). The simulation with respect to the detailed design may be executed by the analysis section, or by an external device. In the case of the simulation with respect to the detailed design by the analysis section, steps S2 to S7 will be automatically executed by the above-described device design system.

In this embodiment, the process steps from input of the required specification in step S1 to the end of simulation with respect to the detailed design in step S7 may be contained in the procedures of the device design method.

<<SECOND EXAMPLE>>

The first example of the procedures of the device design method as described above exemplifies extraction of one structure conforming to the required specification from the preliminarily constructed design database in step S2. It is possible to execute the procedure as a second example to be described below. The second example will be described referring to FIG. 11.

Like the first example, in the second example of the procedure of the device design method according to the first embodiment, before starting the device design, the design database is constructed as prior work as shown in FIG. 11. The design database stores data of the device structure in association with characteristics.

After starting the device design, the required specification is input (step S11). The required specification includes characteristics and the characteristic range. The step S11 is executed through the input/output section of the device design system.

The design data approximate to the required specification are narrowed down from the preliminarily constructed design database (step S12). The design data approximate to the required characteristic are defined as those within the predetermined range corresponding to the required characteristic in the characteristic space. The step S12 is executed by the extraction section of the device design system.

The narrowed down design data are subjected to cluster analysis (step S13). In the cluster analysis, the design data are classified in characteristic-structure space to make a plurality of clusters so that characteristics in the respective clusters are analyzed. The step S13 is executed by the analysis section of the device design system.

The correlation analysis is executed in the respective clusters formed through the cluster analysis (step S14). In the correlation analysis, the correlation between the structure and the characteristic in the respective clusters is analyzed so as to extract the tuning parameter. The step S14 is executed by the analysis section of the device design system.

The extracted data in the respective clusters derived from the correlation analysis and the tuning parameters are output (step S15). The step S15 is executed through the input/output section of the device design system.

In the above-described steps from S11 to S15, upon input of the required specification by the designer in step S11, steps S12 to S15 will be automatically executed by the above-described device design system.

Then the detailed design is simulated using output extracted data in the respective clusters and the tuning parameters (step S16). The detailed design is simulated through the process for adjusting the structure of the extracted data in the respective clusters using the tuning parameters, and simulating the detailed design of the adjusted structure. The detailed design may be simulated by the analysis section, or the external device. In the case of the detailed design simulation executed by the analysis section, process steps from S12 to S16 will be automatically executed by the above-described device design system.

In the second example, the plurality of clusters are made and analyzed. This is advantageous in avoidance of inclination towards biased solutions. For example, if the single structure conforming to the required specification is extracted, there is only one structure as the candidate, which is likely to be inclined towards the biased solution. On the contrary, analysis of the plurality of clusters as described in the second example allows selection of the desired design data and the tuning parameters from a plurality of candidates. As a result, the inclination towards the biased solution may be avoided.

In the second example, the desired design data and the tuning parameters may be selected from a plurality of candidate combinations by the extraction section of the device design system. Alternatively, they may be selected based on judgement made by the designer.

In the first embodiment, the spring constant Kp is decreased by cutting the support beam, and the mass Mp is increased by adding the member to the movable section in processing the acceleration sensor SSp with starting structure. However, the present invention may be implemented in the manner other than the above-described one. For example, it is also possible to cut the support beam and the movable section, to add the members to the support beam and the movable section, respectively, or to add the member to the support beam and cut the movable section.

In the first embodiment, various MEMS each having different structure/physical parameters are preliminarily formed on the semiconductor wafer, and the MEMS with starting structure is selected based on the diagram of correlation between the structure/physical parameters and the device characteristics. Then the MEMS with starting structure is directly processed (directly shaped) into the MEMS with desired structure. This makes it possible to shorten the MEMS manufacturing TAT.

In the first embodiment, the acceleration sensor is exemplified as the MEMS. However, it is also possible to employ the sensor of arbitrary type, for example, the gyroscope, the microphone, the pressure sensor or the like in non-restrictive manners.

Like the acceleration sensor, the above-described sensor includes the movable section having characteristics determined by the spring and the mass. For example, in the case of the microphone and the pressure sensor for detection in response to distortion of the membrane, rigidity and mass of the membrane correspond to the spring and the mass, respectively. This makes it possible to manufacture the MEMS with desired structure in the short TAT through the method similar to the one exemplifying the acceleration sensor as described in the first embodiment.

As the determinant of the sensor device characteristic is kept unchanged irrespective of the MEMS manufacturing process either for the bulk MEMS or the surface MEMS, the MEMS with desired structure may be manufactured in the short TAT through the method as described in the first embodiment.

Second Embodiment

Figure 12:
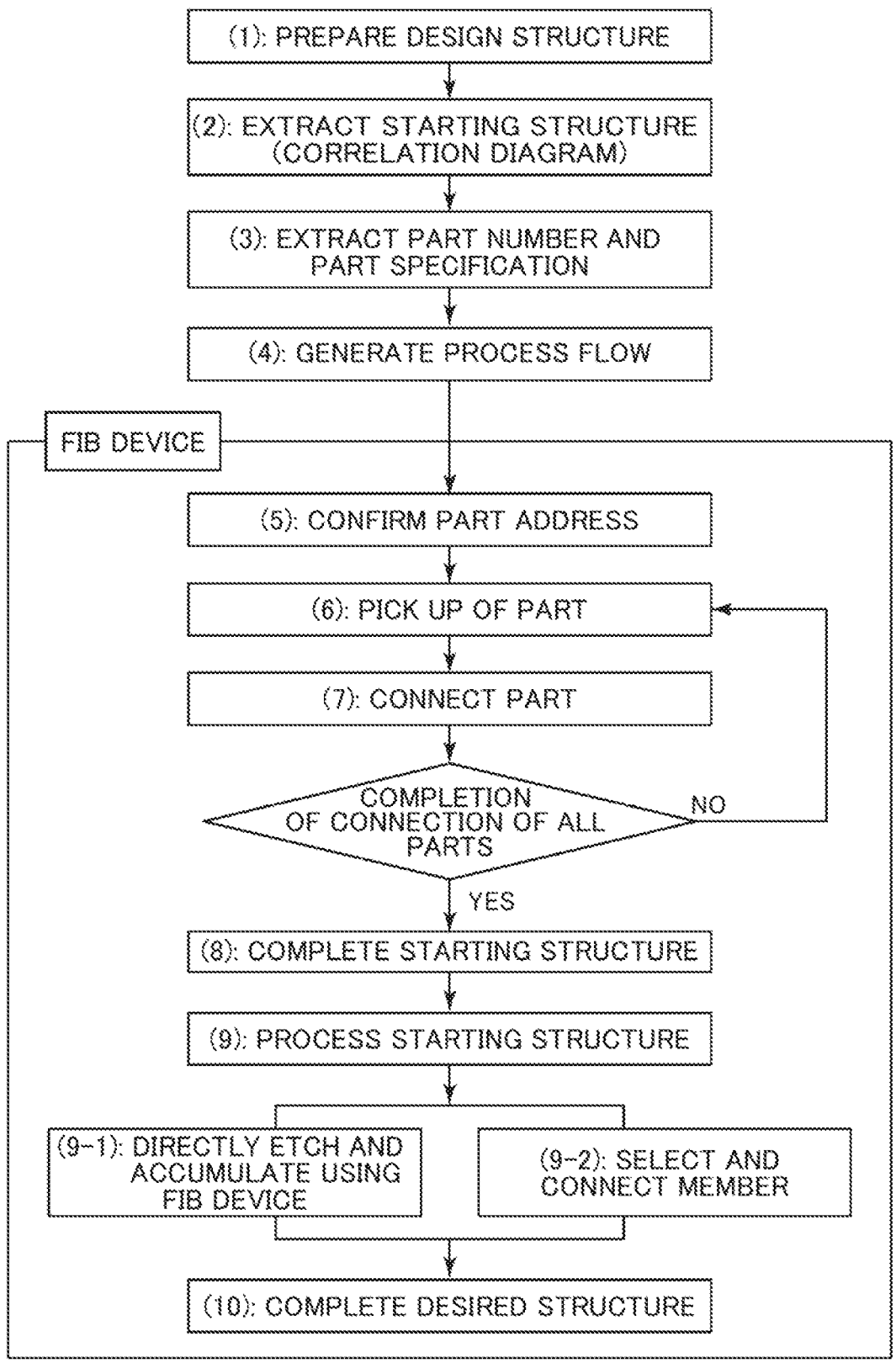
FIG. 12 is a flowchart explaining the MEMS manufacturing method according to a second embodiment.
Figure 13:
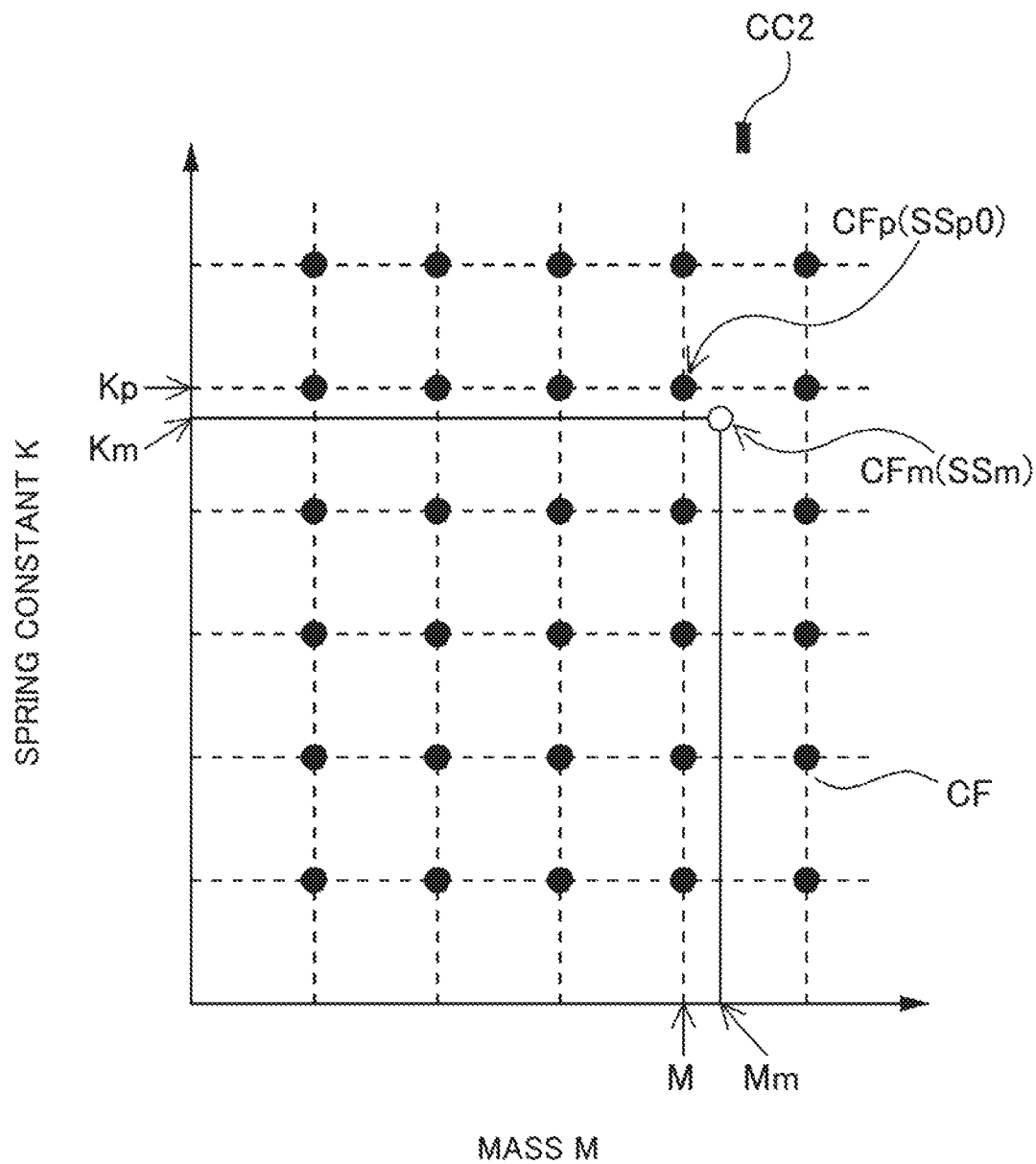
FIG. 13 is a correlation diagram between structure/physical parameters and device characteristics of the designed structure of the acceleration sensor according to the second embodiment.
Figure 16:
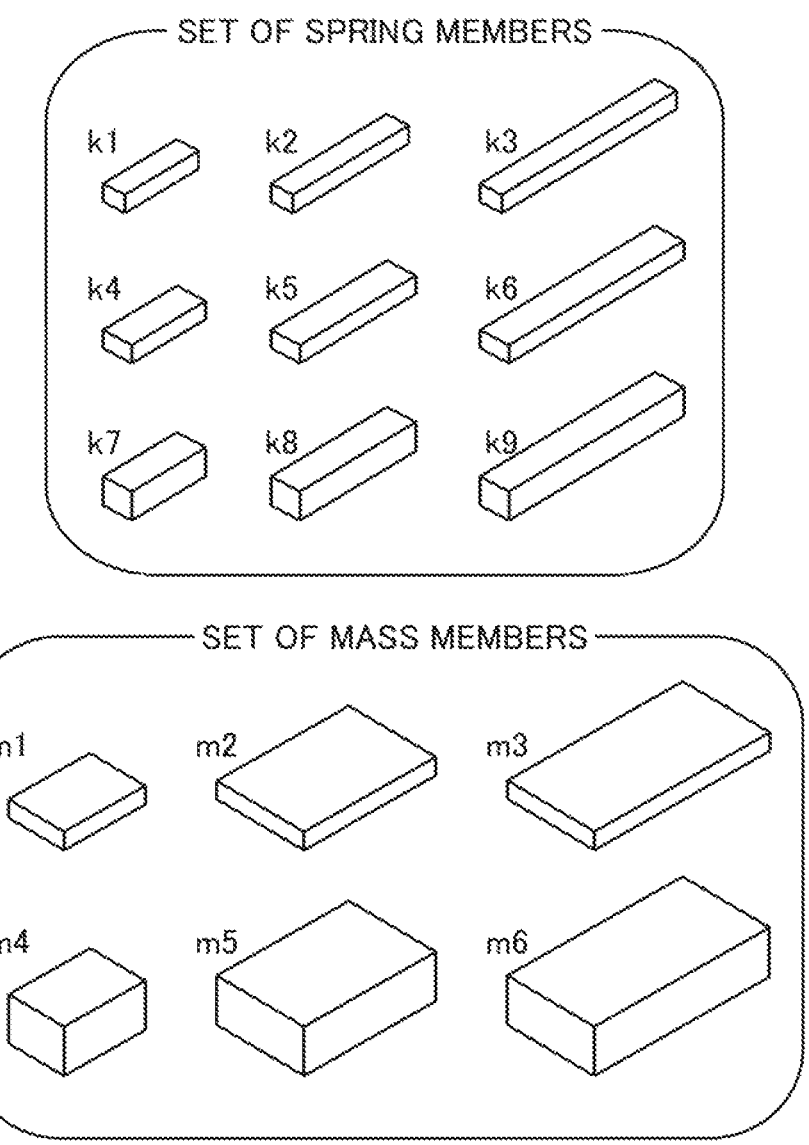
FIG. 16 is a view showing an example of spring members and mass members which have been prepared on a storage place according to the second embodiment.

A MEMS manufacturing method according to a second embodiment will be described referring to FIGS. 12 to 27. Like the first embodiment, the second embodiment is implemented through operations of the FIB device and the information processor. FIG. 12 is a flowchart representing the MEMS manufacturing method according to the second embodiment. FIG. 13 is a correlation diagram between structure/physical parameters and device characteristics of the designed structure of the acceleration sensor according to the second embodiment. FIG. 14 is a view showing data of the part number, part address, and part specification of the spring member, which are stored in the part database according to the second embodiment. FIG. 15 is a view showing an exemplary process flow of the acceleration sensor with desired structure according to the second embodiment. FIG. 16 is a view showing an example of the spring members and mass members which have been prepared on the storage place according to the second embodiment. FIGS. 17, 18, 19, 21, 23 and 24 show the respective steps for manufacturing the acceleration sensor with desired structure according to the second embodiment. FIG. 20 is a view showing an example of the process recipe of the spring member according to the second embodiment. FIG. 22 is a view showing an example of the process recipe for processing the acceleration sensor with starting structure according to the second embodiment. FIGS. 25, 26, and 27 show the respective examples of the method for bonding two members according to the second embodiment.

The second embodiment exemplifies the acceleration sensor as the MEMS. However, it is possible to employ the gyroscope, the microphone, the pressure sensor or the like in non-restrictive manners. The MEMS may be arbitrarily formed into the bulk MEMS manufactured by processing the substrate, or the surface MEMS manufactured by processing the film accumulated on the substrate surface.

The MEMS manufacturing method according to the second embodiment will be described referring to the flowchart as shown in FIG. 12.

(1) Preparation for Design Structure

The information processor prepares the correlation diagram CC2 between the structure/physical parameters and the device characteristics with respect to the MEMS design structure as shown in FIG. 13.

If the structure/physical parameters are required for obtaining, for example, the natural frequency as the device characteristic of the desired acceleration sensor, the information processor selects the spring constant K of the support beam and the mass M of the movable section of the acceleration sensor. Then the information processor calculates the natural frequency CF using the spring constant K of the support beam and the mass M of the movable section so as to generate the correlation diagram CC2 as shown in FIG. 13.

Each of the plurality of black dots shown in FIG. 13 denotes the natural frequency CF derived from calculation using the spring constant K of the support beam and the mass M of the movable section.

In this case, the spring constant K of the support beam and the mass M of the movable section are selected as the structure/physical parameters. However, they are not limited to those described above. For example, it is possible to select the dimension (thickness or width), density, hardness, material constant, or Young's modulus of the component of the acceleration sensor.

(2) Extraction of Starting Structure (Correlation Diagram)

The information processor selects the natural frequency CFp of design specification, approximate to the natural frequency CFm of required specification from the correlation diagram CC2 as shown in FIG. 13. It is possible to select the single or a plurality of natural frequencies CFm of design specification. This case, however, exemplifies selection of the single natural frequency CFp of design specification approximate to the natural frequency CFm of required specification. It is preferable to select the natural frequency CFp of design specification that is the most approximate to the natural frequency CFm of required specification among those around the natural frequency CFm.

Then the information processor determines the spring constant Kp of the support beam and the mass Mp of the movable section, from which the selected natural frequency CFp of design specification is derived. In reference to the correlation diagram CC2 as shown in FIG. 13, the information processor is capable of selecting the acceleration sensor SSp0 with starting structure having the natural frequency CFp of design specification, which is approximate to the acceleration sensor SSm with desired structure having the natural frequency CFm of required specification.

(3) Extraction of Part Number and Part Specification

The information processor extracts the spring member having spring constant Kp of the support beam and the mass Mp of the movable section of the acceleration sensor SSp0 with starting structure, which has been extracted in the process step of "(2) Extraction of starting structure (Correlation diagram)" from the part database.

A part database 140 as shown in FIG. 14 stores data of a part name 141, a part number 142, a part address 143, and a dimension as part specification of each member preliminarily prepared on the storage place. The spring constant and the mass may be contained in the part specification. Referring to FIG. 14, the part database 140 stores various data concerning the spring members each designated with the part number 142 (k1 to k9). This applies to the mass member, the substrate, and the anchor.

The second embodiment exemplifies extraction of a spring member k8 and a mass member m5 respectively corresponding to the spring constant Kp of the support beam and the mass Mp of the movable section of the acceleration sensor SSp0 with starting structure, which has been extracted in the process step of "(2) Extraction of starting structure (Correlation diagram)" from the part database. The substrate s and the anchor a2 are also extracted in the similar manner.

(4) Generation of Process Flow

The information processor makes the process flow for forming the acceleration sensor SSm with desired structure. FIG. 15 shows an example of a process flow 150 for forming the acceleration sensor SSm with desired structure. The process flow 150 may be made partially or entirely by the operator of the FIB device.

Referring to FIG. 15, the process flow 150 includes a process No. 151, a process name 152, a part name 153, a part number 154, a layout layer number 155, an angle 156, and a process recipe number 157. The information processor inputs various conditions for manufacturing the acceleration sensor SSp with starting structure into the process flow 150.

The information processor inputs the process name 152 (substrate, acquisition of part, connection of part), and further specifications of the respective process steps. The specifications of the respective process steps include the part number 154, the layout layer number 155, the angle 156, and the process recipe number 157.

If the member is the anchor, that is, the part name 153 is the anchor, the information processor inputs the code a2 into the part number 154 corresponding to the acquisition of part as the process name 152. The information processor further inputs the number 1 into the layout layer number 155 corresponding to the connection of part as the process name 152, the number 0 into the angle 156, and the number 14 into the process recipe number 157, respectively.

If the member is the spring member, that is, the part name 153 is the spring, the information processor inputs the code k8 into the part number 154 corresponding to the acquisition of part as the process name 152. The information processor further inputs the number 2 into the layout layer number 155 corresponding to the connection of part as the process name 152, the number 0 into the angle 156, and the number 12 into the process recipe number 157, respectively.

If the member is the mass member, that is, the part name 153 is the mass, the information processor inputs the code m5 into the part number 154 corresponding to the acquisition of part as the process name 152. The information processor further inputs the number 3 into the layout layer number 155 corresponding to the connection of part as the process name 152, the number 0 into the angle 156, and the number 26 into the process recipe number 157, respectively.

Then the information processor inputs various conditions for forming the acceleration sensor SSm with desired structure by processing the acceleration sensor SSp with starting structure into the process flow 150.

The information processor inputs the process name 152 (processing of structure), the number 4 into the layout layer number 155, and the number 18 into the process recipe number 157.

(5) Confirmation of Part Address

The FIB device confirms the part address 143 of the spring member k8 in reference to the part database 140 as shown in FIG. 14, for example. Likewise, the FIB device confirms each part address of the mass member m5, the substrate s, and the anchor a2.

The respective members are preliminarily prepared on the storage place as shown in FIG. 16. Various spring members each having a different value of the spring constant K, and various mass members each having a different value of the mass M are preliminarily prepared on the storage place. Additionally, various substrates (not shown) and various anchors (not shown) are prepared. Furthermore, the second embodiment exemplifies 9 spring members and 6 mass members, which are not limited to those shown in the drawing. This makes it possible to easily locate the required member stored on the storage place in reference to the part address of the respective members in the part database.

(6) Pick-up of Part and (7) Connection of Part

In accordance with the process flow 150 as shown in FIG. 15, the acceleration sensor SSp with starting structure is assembled. Specifically, the member at the position corresponding to the part address is picked up from those preliminarily prepared on the storage place, and the picked up member is connected to the other member so as to assemble the acceleration sensor SSp with starting structure. The FIB device as described in the first embodiment is configured to assemble the acceleration sensor SSp with starting structure.

Figure 17A:
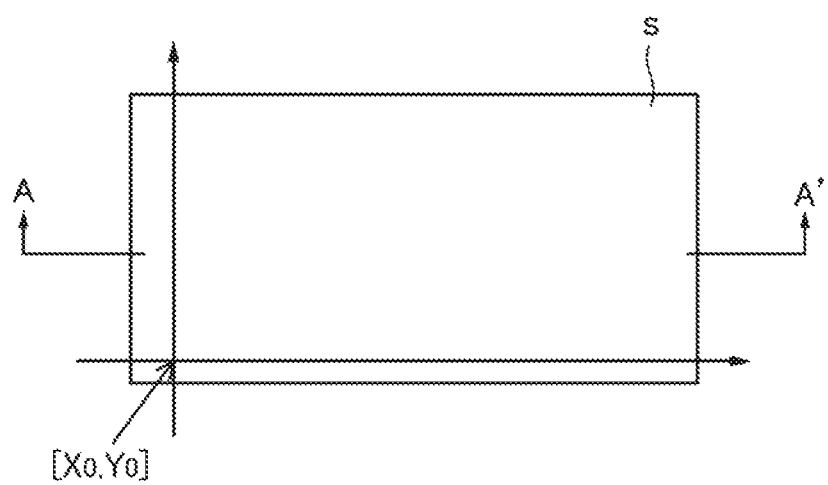
FIG. 17A is a plan view showing the process of manufacturing the acceleration sensor with desired structure according to the second embodiment.
Figure 17B:
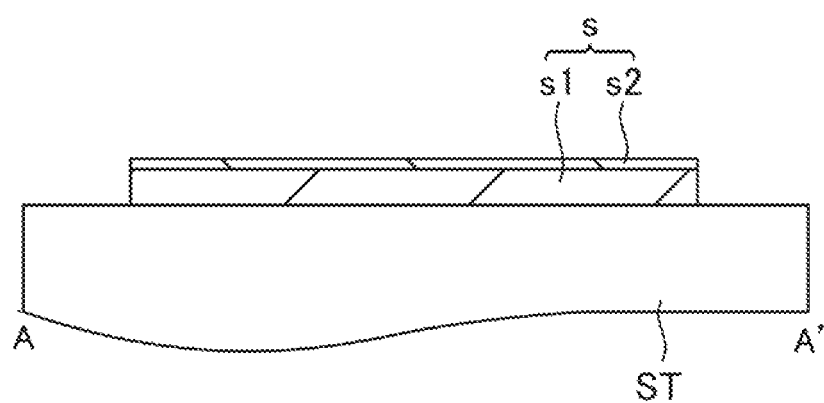
FIG. 17B is a sectional view taken along line A-A' of FIG. 17A.

As FIGS. 17(a) and (b) show, the FIB device picks up the substrate s from the storage place ("(6) part pick-up" process step), and connects (mounts) the substrate s onto a stage ST (Process No. 1 of the process flow 150 as shown in FIG. 15) ("(7) part connection" process step). The substrate s is mounted in reference to a point of origin $[X_0, Y_0]$ on the stage ST. The substrates includes a silicon substrate s1 and an insulation film s2 formed on a main surface of the silicon substrate s1. The insulation film S2 is made from silicon oxide, for example. Then the FIB device judges whether connection of all parts has been completed. If the connection has not been completed, the process steps of "(6) part pick-up" and "(7) part connection" are executed repeatedly for the rest of the parts.

Figure 18A:
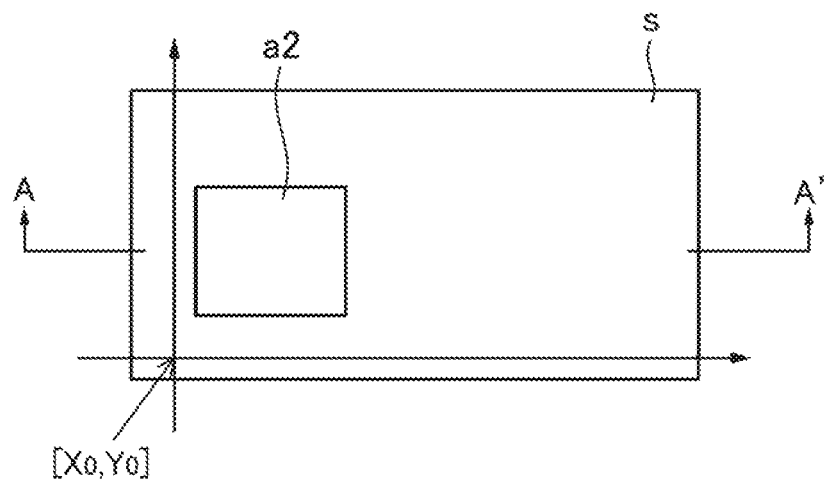
FIG. 18A is a plan view showing the process of manufacturing the acceleration sensor with desired structure according to the second embodiment.
Figure 18B:
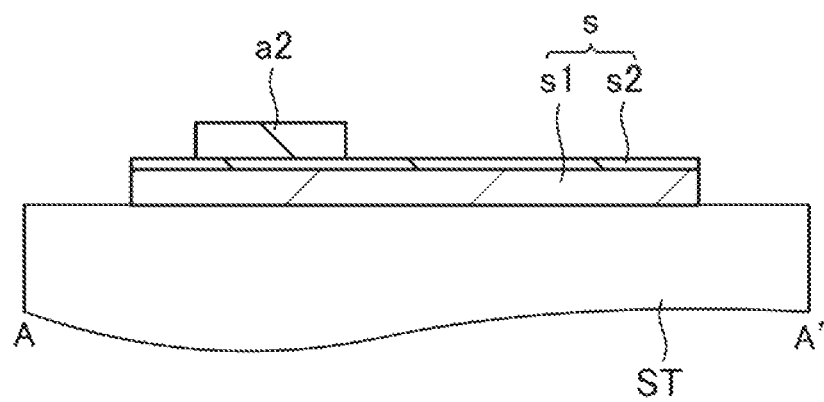
FIG. 18B is a sectional view taken along line A-A' of FIG. 18A.

As FIGS. 18(a) and (b) show, the FIB device picks up the anchor a2 from the storage place, and connects the anchor a2 onto the substrate s (process Nos. 2 and 3 of the process flow 150 as shown in FIG. 15). The anchor a2 is connected onto the substrate s in accordance with the process recipe number 14. In accordance with the layout corresponding to the number 1 as the layout layer number 155, the connection position of the anchor a2 is determined in reference to the point of origin $[X_0, Y_0]$ on the stage.

Figure 19A:
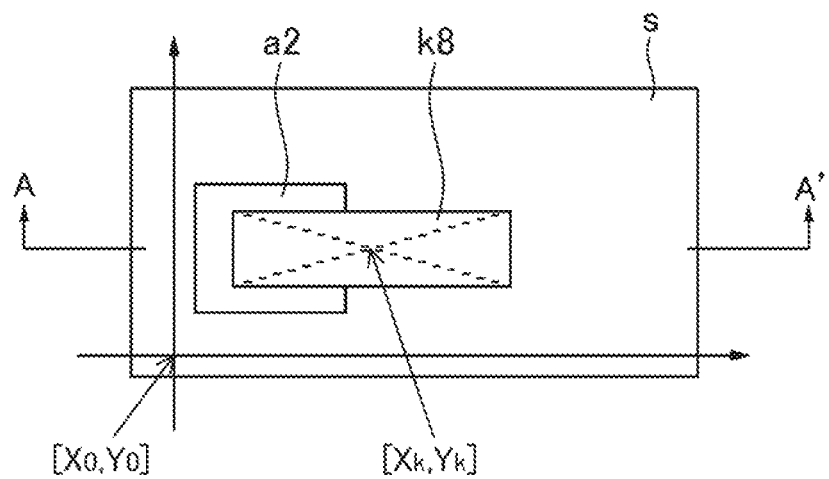
FIG. 19A is a plan view showing the process of manufacturing the acceleration sensor with desired structure according to the second embodiment.
Figure 19B:
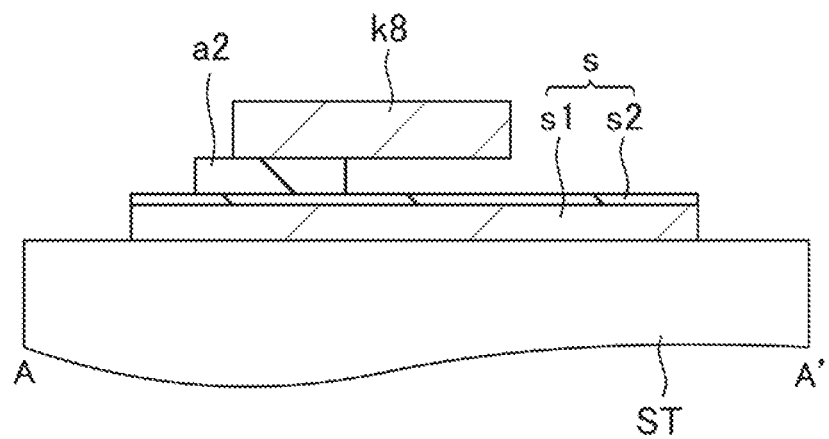
FIG. 19B is a sectional view taken along line A-A' of FIG. 19A.

As FIGS. 19(a) and (b) show, the FIB device picks up the spring member k8 from the storage place, and connects the spring member k8 onto the anchor a2 (process Nos. 4 and 5 of the process flow 150 as shown in FIG. 15). The spring member k8 is connected onto the anchor a2 in accordance with the process recipe number 12 as shown in FIG. 20. In accordance with the layout corresponding to the number 2 as the layout layer number 155, the connection position is determined in reference to the point of origin $[X_0, Y_0]$ on the stage using the center coordinate of the spring member k8, that is, $[X_k, Y_k]$.

Figure 21A:
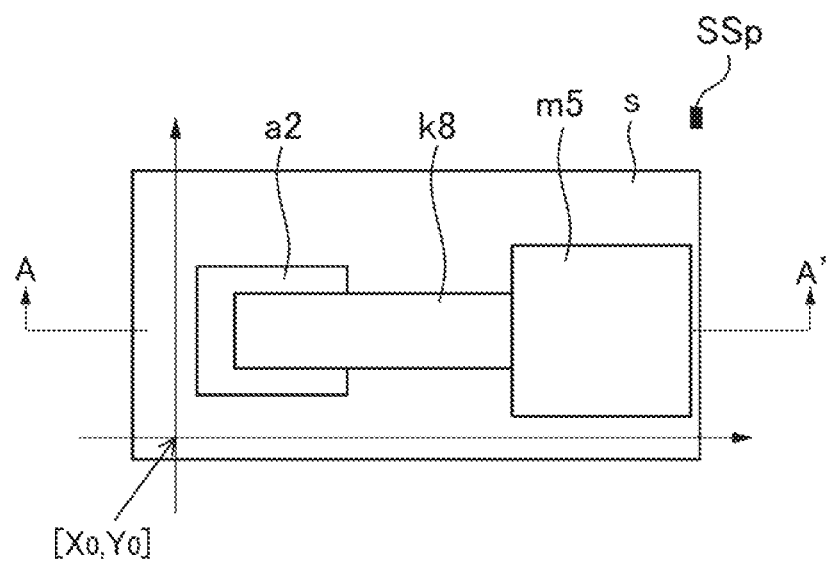
FIG. 21A is a plan view showing the process of manufacturing the acceleration sensor with desired structure according to the second embodiment.
Figure 21B:
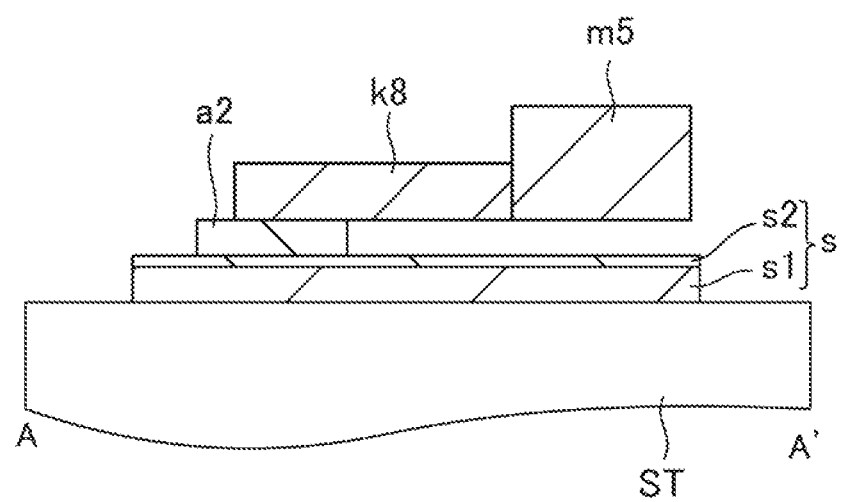
FIG. 21B is a sectional view taken along line A-A' of FIG. 21A.

As FIGS. 21(a) and (b) show, the FIB device picks up the mass member m5 from the storage place, and connects the mass member m5 onto the spring member k8 (process Nos. 6 and 7 of the process flow 150 as shown in FIG. 15). The mass member m5 is connected to the spring member k8 in accordance with the process recipe number 26. In accordance with the layout corresponding to the number 3 as the layout layer number 155, for example, the connection position is determined in reference to the point of origin $[X_0, Y_0]$ on the stage.

(8) Completion of Starting Structure

When connection of all parts is completed by executing process steps from No. 1 to No. 7 of the process flow as shown in FIG. 15, the acceleration sensor SSp with starting structure is completed.

(9) Processing of Starting Structure

There is an error between the spring constant Kp of the spring member k8 of the acceleration sensor SSP with starting structure manufactured in the process step of "(8) Completion of starting structure" and the spring constant Km of the support beam of the acceleration sensor SSm with desired structure. Likewise, there is an error between the mass Mp of the mass member m5 of the acceleration sensor SSp with starting structure and the mass Mm of the movable section of the acceleration sensor SSm with desired structure. The acceleration sensor SSp with starting structure cannot provide the natural frequency CFm of required specification.

The acceleration sensor SSp with starting structure is then directly processed (directly shaped) so as to form the acceleration sensor SSm with desired structure. For example, the spring member k8 may be cut to decrease the spring constant Kp, or the member may be added to the mass member m5 to increase the mass Mp. This makes it possible to form the acceleration sensor SSm with desired structure.

The acceleration sensor SSp with starting structure may be processed in accordance with the following procedures.

The FIB device subjects the completed acceleration sensor SSp with starting structure to the process No. 8 of the process flow 150 as shown in FIG. 15. The process is executed in accordance with the process recipe number 18 as shown in FIG. 22. Assembly and processing of the acceleration sensor SSp with starting structure may be executed in sequence in the same FIB device as a series of processing.

(9-1) Direct Etching and Accumulation Using FIB Device

Figure 23A:
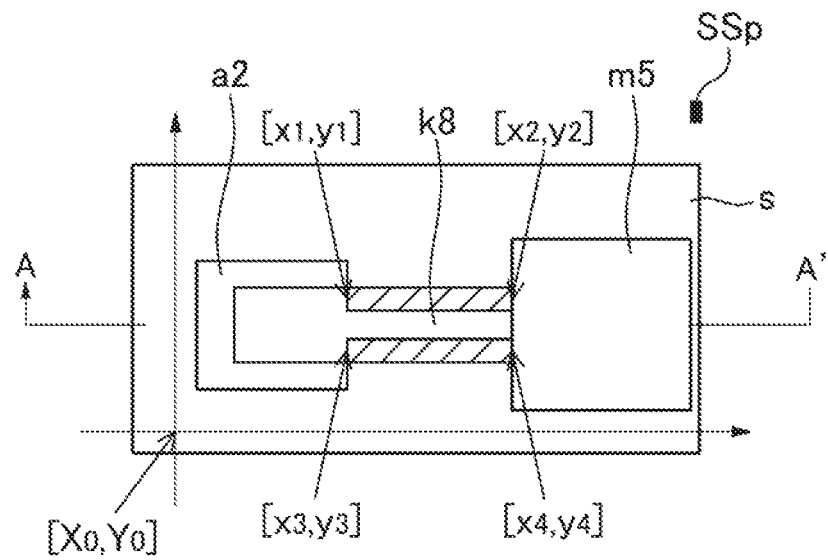
FIG. 23A is a plan view showing the process of manufacturing the acceleration sensor with desired structure according to the second embodiment.
Figure 23B:
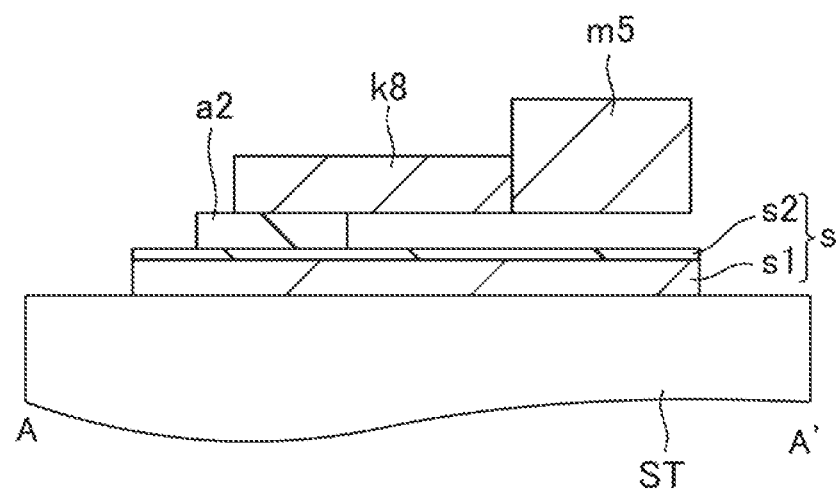
FIG. 23B is a sectional view taken along line A-A' of FIG. 23A.

As FIGS. 23(a) and (b) show, the FIB device cuts the spring member k8 of the acceleration sensor SSp with starting structure. The hatching region of FIG. 23(a) denotes the cut part. The region to be cut is set in reference to the point of origin on the stage [$X_0$, $Y_0$] with respect to the region that allows cutting of the spring member k8 of the acceleration sensor SSp with starting structure ([$x_1$, $y_1$]-[$x_2$, $y_2$], [$x_3$, $y_3$]-[$x_4$, $y_4$]) in accordance with the layout corresponding to the number 4 as the layout layer number 155.

Figure 24A:
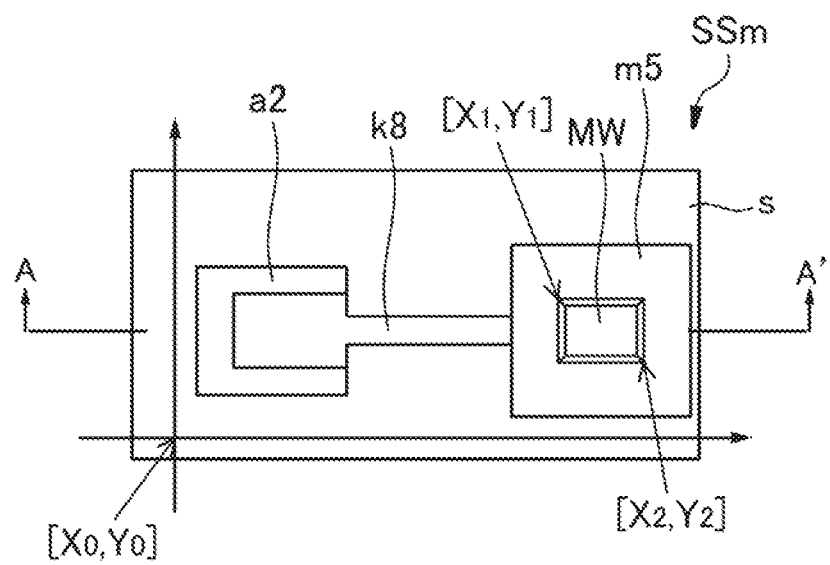
FIG. 24A is a plan view showing the process of manufacturing the acceleration sensor with desired structure according to the second embodiment.
Figure 24B:
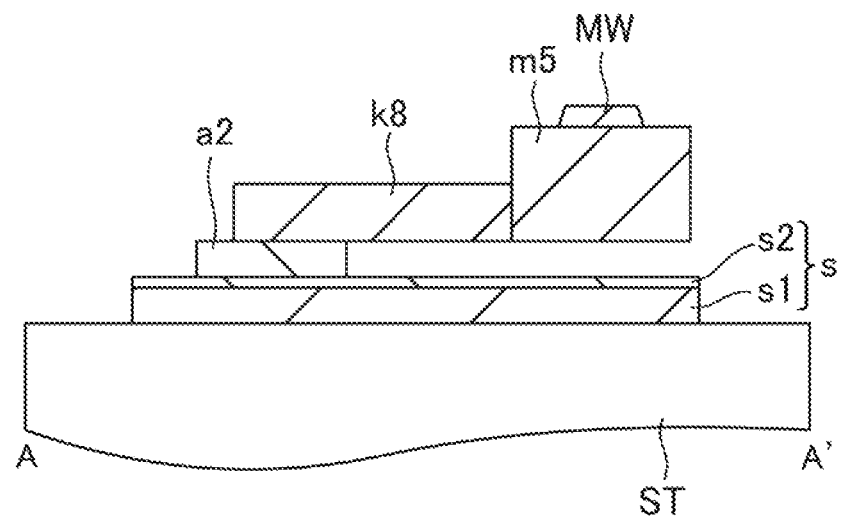
FIG. 24B is a sectional view taken along line A-A' of FIG. 24A.

As FIGS. 24(a) and (b) show, the FIB device adds the member MW onto the mass member m5 of the acceleration sensor SSp with starting structure in accordance with the other process recipe. The region to which the member MW is added is set in accordance with the layout corresponding to, for example, the number 4 as the layout layer number 155 with respect to the region that allows addition of the mass of the mass member m5 ([$X_1$, $Y_1$]-[$X_2$, $Y_2$]) in reference to the point of origin [$X_0$, $Y_0$] on the stage. The ion beam and deposition gas are directly irradiated to the set mass addition region so that the member is directly applied for film formation onto the mass member m5 of the acceleration sensor SSp with starting structure.

This makes it possible to form the acceleration sensor SSm with desired structure.

(9-2) Selection and Connection of Member

Like the first embodiment, the FIB device maybe configured to select the member MW to be transferred to the mass member m5, and connected thereto so that the member MW is added to the mass member m5.

Generally, the member MW is added to the mass member m5 using the FIB device through the method for irradiating the fixed section with the ion beam while spraying the gas material to be turned into carbon through reaction with the irradiated ion beam. However, there are concerns that the above-described method fails to impart sufficient strength to the fixed section of the acceleration sensor to which vibration is applied.

The second embodiment employs the bonding method for imparting fixing strength sufficient to prevent destruction of the acceleration sensor under such interference as vibration.

Figure 25A:
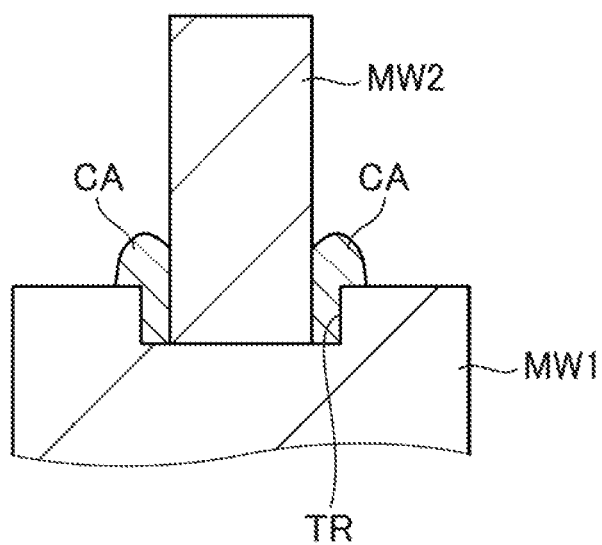
FIGS. 25A and 25B are sectional views each explaining a first method of bonding two members according to the second embodiment.
Figure 25B:
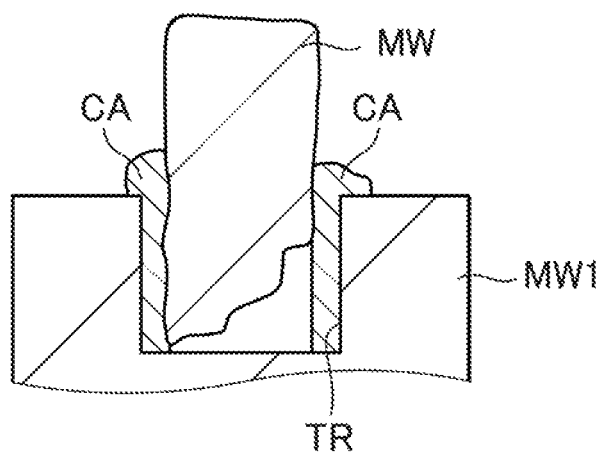

FIGS. 25(a) and (b) are sectional views explaining a first method of bonding a first member and a second member according to the second embodiment. FIG. 25(a) is a sectional view representing the state where a rectangular parallelepiped second member MW2 (for example, the member MW) is fixed onto the upper surface of the first member MW1 (for example, the mass member m5). (b) is a sectional view representing the state where the second member MW2 (for example, the member MW) having a missing part is fixed onto the upper surface of the first member MW1 (for example, the mass member m5).

The FIB device irradiates the first member MW1 with the ion beam so that a groove TR having a predetermined depth is formed in the upper surface of the first member MW1. In this case, the groove TR is generated so that its dimension in plan view is larger than that of the second member MW2 in plan view, which is bonded to the first member MW1, and the resultant dimension difference is larger than 0 µm, and equal to or smaller than 1 µm.

The FIB device operates the manipulator 15 (see FIG. 9) so that the second member MW2 is transferred to a position where the groove TR is generated in the first member MW1, and fit with the groove TR.

The FIB device irradiates the ion beam simultaneously with irradiation of the gas material to be turned into carbon through reaction with the irradiated ion beam so that the respective contact surfaces of the first member MW1 and the second member MW2 are bonded through a carbon layer CA. Preferably, the carbon generated through the above-described reaction has purity of 99.9% or higher.

Compared with bonding of the second member MW2 to the upper surface of the first member MW1 without generating the groove TR, the above-described bonding increases the contact area between the first member MW1 and the second member MW2. This makes it possible to bond the first member MW1 and the second member MW2 with desired bonding strength.

Figure 26A:
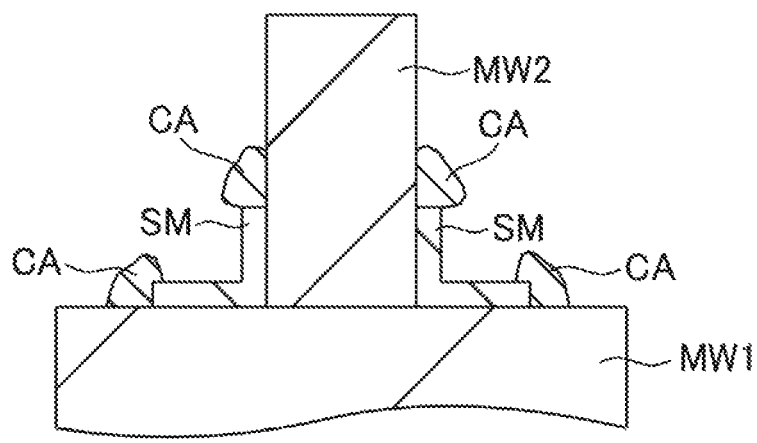
FIGS. 26A and 26B are sectional views each explaining a second method of bonding two members according to the second embodiment.
Figure 26B:
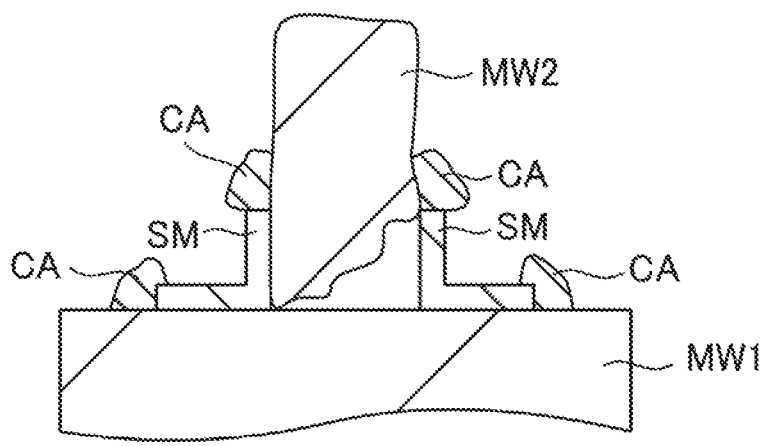

FIGS. 26(a) and (b) are sectional views explaining a second method of bonding the first member and the second member according to the second embodiment. FIG. 26(a) is a sectional view representing the state where the rectangular parallelepiped second member MW2 (for example, the member MW) is fixed onto the upper surface of the first member MW1 (for example, the mass member m5). (b) is a sectional view representing the state where the second member MW2 (for example, the member MW) having a missing part is fixed to the upper surface of the first member MW1 (for example, the mass member m5).

The FIB device operates the manipulator 15 (see FIG. 9) so that a support member SM is transferred to a predetermined position on the upper surface of the first member MW1 to which the ion beam is irradiated. Simultaneously, the FIB device irradiates the gas material to be turned into carbon through reaction with the irradiated ion beam so that the respective contact surfaces of the first member MW1 and the support member SM are bonded through the carbon layer CA. Preferably, the carbon generated through the above-described reaction has purity of 99.9% or higher. In this case, in consideration of the position of the second member MW2 to be fixed to the first member MW1 in the subsequent process, the support member SM is bonded to the upper surface of the first member MW1. It is possible to use either the single support member SM or a plurality of support members SM.

The FIB device operates the manipulator 15 so that the second member MW2 is transferred to a predetermined position surrounded by the support members SM on the upper surface of the first member MW1, and fit with the position defined by the support members SM.

The FIB device irradiates the ion beam simultaneously with irradiation of the gas material to be turned into carbon through reaction with the irradiated ion beam so that the respective contact surfaces of the support member SM and the second member MW2, and the respective contact surfaces of the first member MW1 and the second member MW2 are bonded through the carbon layer CA. Preferably, the carbon generated through the above-described reaction has purity of 99.9% or higher.

Compared with bonding of the second member MW2 to the upper surface of the first member MW1 without using the support member SM, the above-described bonding increases the contact points between the first member MW1 and the second member MW2. This makes it possible to bond the first member MW1 and the second member MW2 with desired bonding strength.

Figure 27A:
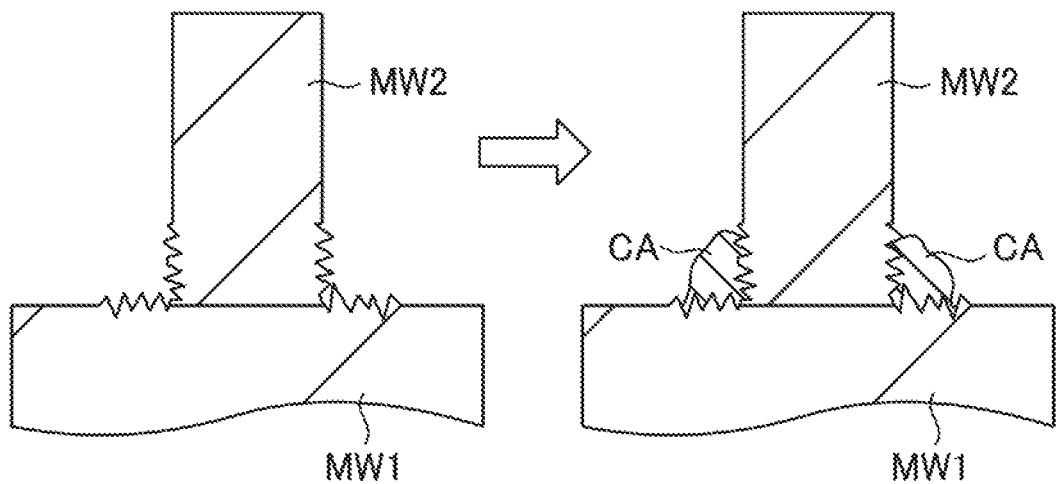
FIGS. 27A and FIG. 27B are sectional views each explaining a third method of bonding two members according to a third embodiment.
Figure 27B:
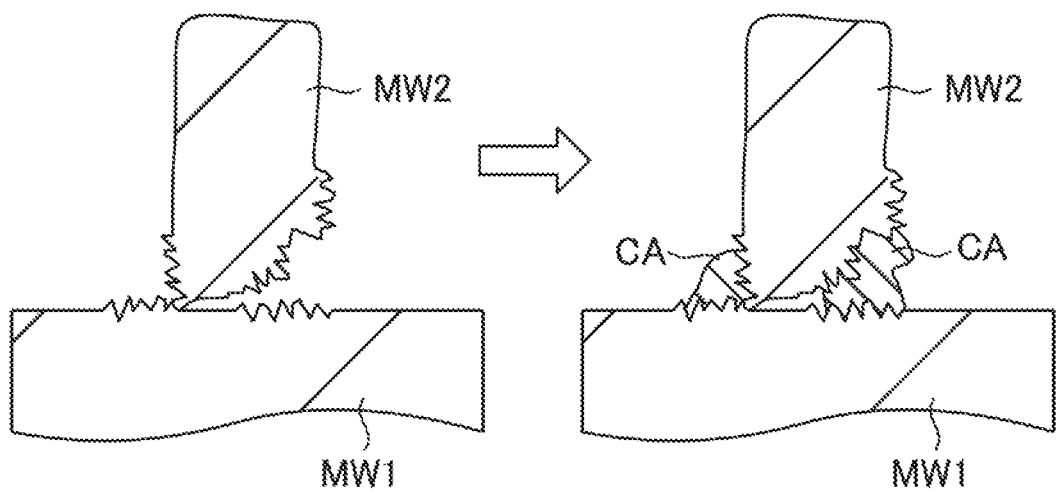

FIGS. 27(a) and (b) are sectional views for explaining a third method of bonding the first member and the second member according to the second embodiment. FIG. 27(a) is a sectional view representing the state where the rectangular parallelepiped second member MW2 (for example, the member MW) is fixed to the upper surface of the first member MW1 (for example, the mass member m5). (b) is a sectional view representing the state where the second member MW2 (for example, the member MW) having a missing part is fixed to the upper surface of the first member MW1 (for example, the mass member m5).

The FIB device operates the manipulator 15 (see FIG. 9) so that the second member MW2 is transferred to a predetermined position on the upper surface of the first member MW1 to which the ion beam is irradiated. Simultaneously with the ion beam irradiation, the FIB device irradiates the gas material to be turned into carbon through reaction with the irradiated ion beam so that the respective contact surfaces of the first member MW1 and the second member MW2 are bonded through the carbon layer CA. Preferably, the carbon generated through the above-described reaction has purity of 99.9% or higher.

The FIB device irradiates the ion beam to the side surface at the lower part of the second member MW2, and to the upper surface of the first member MW1 around the part to which the second member MW2 is bonded. The FIB device then executes etching to roughen the side surface at the lower part of the second member MW2 and the upper surface of the first member MW1 around the part to which the second member MW2 is bonded.

The FIB device irradiates the ion beam simultaneously with irradiation of the gas material to be turned into carbon through reaction with the irradiated ion beam so that the respective contact surfaces of the first member MW1 and the second member MW2 are bonded through the carbon layer CA. Preferably, the carbon generated through the above-described reaction has purity of 99.9% or higher. If the carbon layer CA used for bonding the first member MW1 and the second member MW2 is formed into the film shape, it is preferable to make each surface roughness of the first member MW1 and the second member MW2 corresponded to the degree similar to the particle size of the carbon generated through the reaction.

Compared with the case where the respective surfaces of the first member MW1 and the second member MW2 are not partially roughened, the above-described bonding increases the area where carbon adheres to the first member MW1 and the second member MW2. This makes it possible to bond the first member MW1 and the second member MW2 with desired bonding strength.

(10) Completion of Desired Structure

Execution of process steps from "(1) Preparation of design structure" to "(9) Processing of starting structure" completes the acceleration sensor SSm with desired structure.

At least the process steps from "(5) Confirmation of part address" to "(10) Completion of desired structure" may be sequentially executed in the same FIB device as a series of processing. Specifically, process steps of pick-up of part and connection of part are repeatedly executed based on the process flow and the process recipe so as to allow the same FIB device to execute both the process steps for forming the acceleration sensor SSp with starting structure and forming the acceleration sensor SSm with desired structure by processing the acceleration sensor SSp with starting structure.

The database of the FIB device (for example, the database 86 of the FIB device shown in FIG. 9) stores various data such as the part database 140 (see FIG. 14), the process flow 150 (see FIG. 15), and the process recipe (see FIGS. 20 and 22). Based on those data, the process steps of "(6) Pick-up of part", "(7) Connection of part", and "(8) Completion of starting structure" are executed.

In the second embodiment, the members each having different structure/physical parameters are prepared. From among those members, the respective members are extracted based on the correlation diagram between the structure/physical parameters and the device characteristics. The extracted members are connected to form the MEMS with starting structure. The MEMS with starting structure is directly processed (directly shaped) to form the MEMS with desired structure. This makes it possible to shorten the MEMS manufacturing TAT.

The second embodiment exemplifies the acceleration sensor as the MEMS. However, it is possible to employ the gyroscope, the microphone, the pressure sensor or the like in non-restrictive manners.

Like the acceleration sensor, the above-described sensor includes the movable section. Characteristics of the movable section are determined by the spring and the mass. In the case of the microphone and the pressure sensor for detection based on deformation of the membrane, its rigidity and mass correspond to the spring and the mass, respectively. Accordingly, the method similar to the one employing the acceleration sensor as exemplified in the second embodiment allows manufacturing of the MEMS with desired structure in the shortened TAT.

The determinant of the sensor device characteristic is kept unchanged irrespective of the MEMS manufacturing process either for the bulk MEMS or the surface MEMS. The method as described in the second embodiment allows manufacturing of the MEMS with desired structure in the shortened TAT.

Third Embodiment

Figure 28:
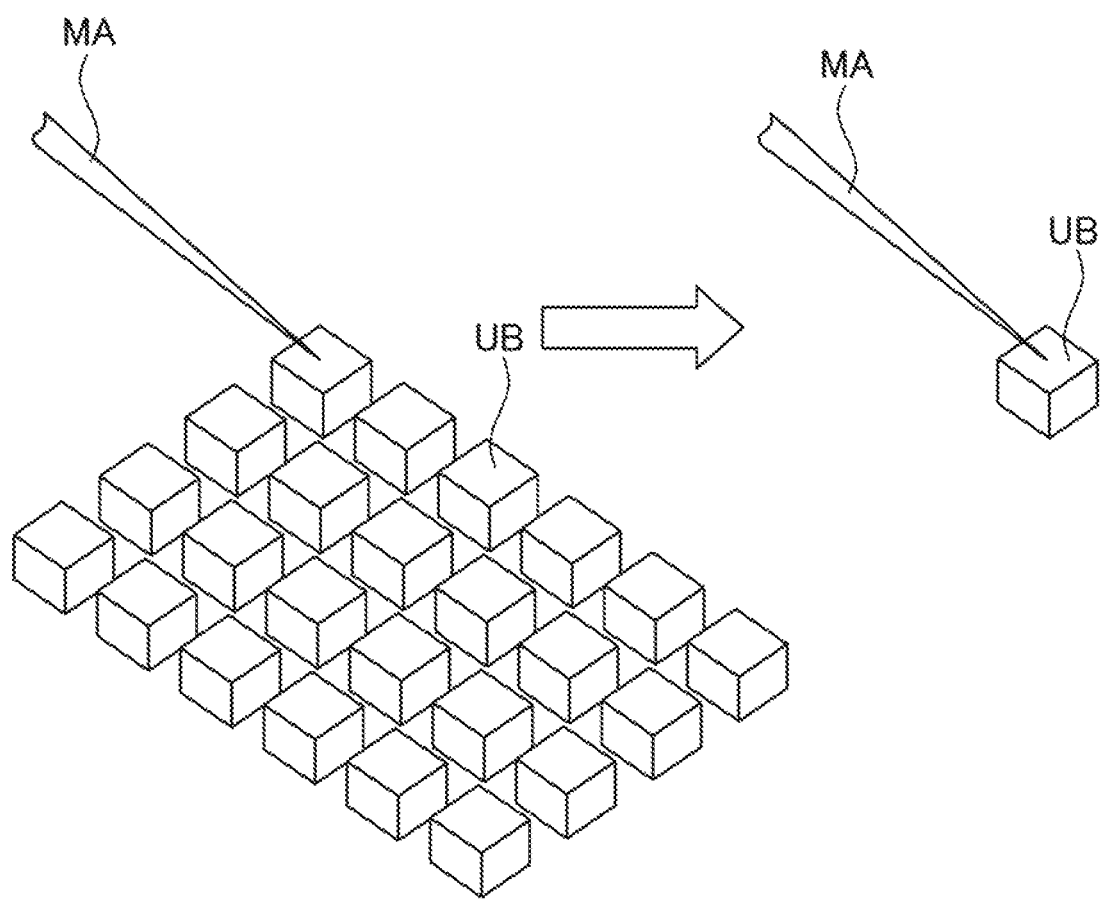
FIG. 28 is a perspective view showing an example of a preliminarily prepared member according to a third embodiment.
Figure 29:
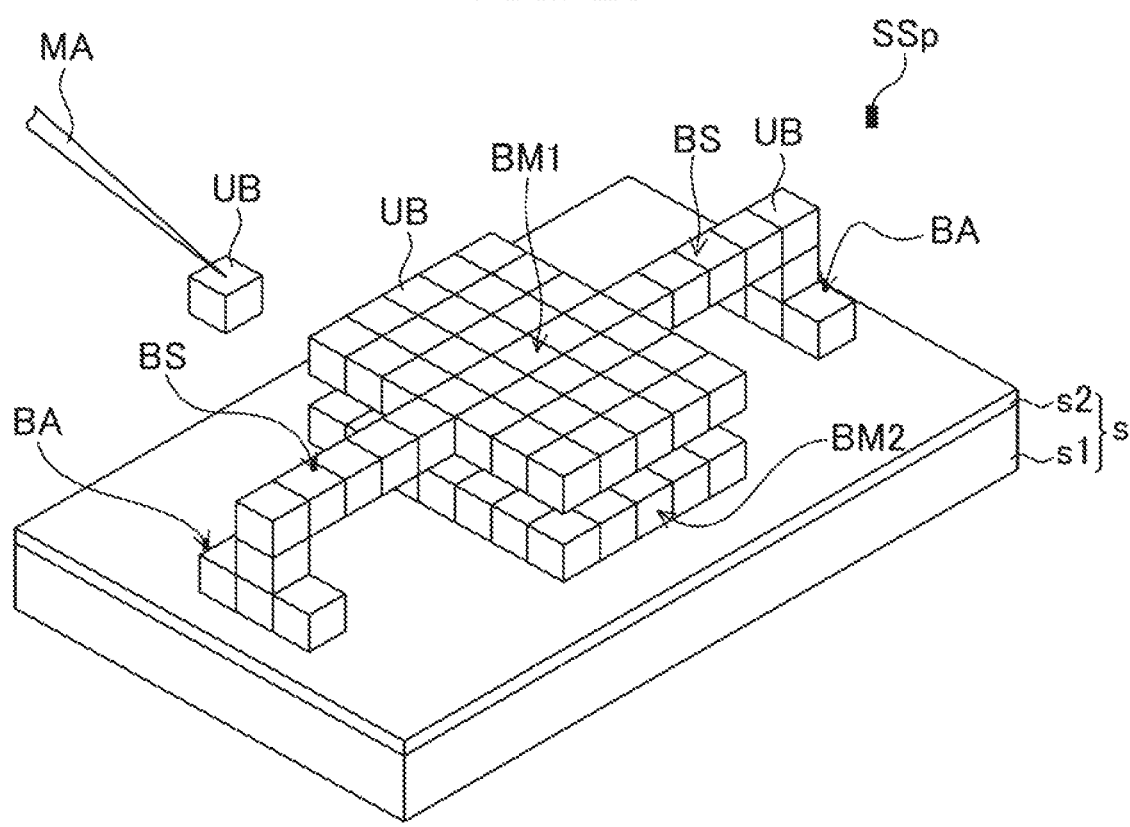
FIG. 29 is a perspective view showing an exemplary structure of the acceleration sensor with starting structure according to the third embodiment.

A method of manufacturing MEMS according to a third embodiment will be described referring to FIGS. 28 and 29. FIG. 28 is a perspective view representing an example of preliminarily prepared members according to the third embodiment. FIG. 29 is a perspective view representing an example of a structure of the acceleration sensor with starting structure according to the third embodiment.

The third embodiment also exemplifies the acceleration sensor as the MEMS. However, it is possible to employ the gyroscope, the microphone, the pressure sensor or the like in non-restrictive manners. Generally, the MEMS may be categorized into the bulk MEMS manufactured by processing the substrate, and the surface MEMS manufactured by processing the film accumulated on the substrate surface. It is possible to employ any type of the MEMS as described above.

In the second embodiment, a plurality of members are preliminarily prepared on the storage place. The FIB device makes the part number in association with the part address in accordance with the process flow so that the desired members are picked up from among those members, and connected for assembling the acceleration sensor SSp with starting structure (see process steps of "(6) Pick-up of part", "(7) Connection of part", and "(8) Completion of starting structure").

Meanwhile, in the third embodiment, a plurality of unit blocks each having the same structure/physical parameters are prepared on the storage place. The FIB device executes process steps of pick-up of the unit blocks from the storage place and connection of the unit blocks repeatedly to assemble the acceleration sensor SSp with starting structure. The process flow according to the third embodiment is similar to the one (see FIG. 15) as described in the second embodiment.

As FIG. 28 shows, a plurality of unit blocks UB are preliminarily prepared on the storage place. In this case, the unit blocks of the same type are prepared. However, it is possible to prepare unit blocks of various types.

The FIB device operates a manipulator MA to pick up the single unit block UB among those preliminarily prepared on the storage place in accordance with the process flow (process step of "(6) Pick-up of part" as described in the second embodiment).

As FIG. 29 shows, in accordance with the process flow (process step of "(7) Connection of part" as described in the second embodiment), the FIB device connects the unit block UB to the substrate s or the unit block UB that has been already connected to the substrate s. Repetitive execution of pick-up and connection of the unit blocks UB by the FIB device in accordance with the process flow completes the acceleration sensor SSp with starting structure (process step of "(8) Completion of starting structure" as described in the second embodiment).

The acceleration sensor SSp includes the substrate s constituted by a silicon substrate s1 and an insulation film s2 formed on the main surface of the silicon substrate s1. The acceleration sensor further includes two anchor sections BA each constituted by the plurality of unit blocks UB, and a second electrode BM2 disposed apart from the respective anchor sections BA, and constituted by the plurality of unit blocks UB on the substrates between the two anchor sections BA. A first electrode MB1 is disposed above the second electrode MB2 at an interval therefrom, and supported with two spring sections BS connected to the two anchor sections BA, respectively.

The unit blocks UB may be connected by static electricity or heat treatment. The unit blocks UB may be connected onto the substrate s by the bonding method as described in the second embodiment (see FIGS. 25, 26, and 27), for example. The use of the bonding method may provide the acceleration sensor SSm with desired structure that exhibits fixed strength sufficient to prevent destruction against such disturbance as vibration.

The FIB device then processes the acceleration sensor SSp with starting structure in substantially the same process step as the "(9) Process of starting structure" as described in the second embodiment, for example, so as to complete the acceleration sensor SSm with desired structure.

The third embodiment allows easy manufacturing of the MEMS only by assembling the preliminarily prepared unit blocks UB into the MEMS with starting structure.

The third embodiment exemplifies the acceleration sensor as the MEMS. It is also possible to employ the gyroscope, the microphone, the pressure sensor or the like in non-restrictive manners.

Like the acceleration sensor, the above-described sensor includes the movable section. Characteristics of the movable section are determined by the spring and the mass. In the case of the microphone and the pressure sensor for detection based on deformation of the membrane, its rigidity and mass correspond to the spring and the mass, respectively. Accordingly, the method similar to the one employing the acceleration sensor as exemplified in the third embodiment allows manufacturing of the MEMS with desired structure in the shortened TAT.

The determinant of the sensor device characteristic is kept unchanged irrespective of the MEMS manufacturing process either for the bulk MEMS or the surface MEMS. The method as described in the third embodiment allows manufacturing of the MEMS with desired structure in the shortened TAT.

Fourth Embodiment

Figure 30A:
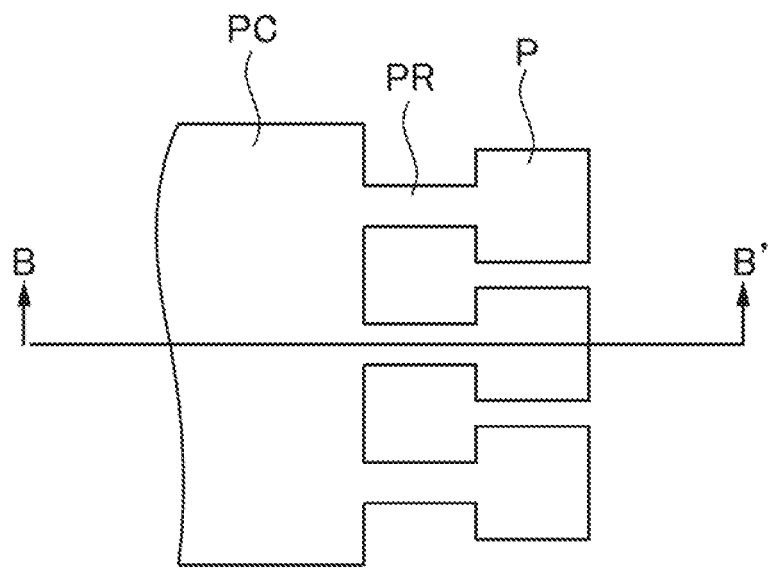
FIG. 30A is a plan view showing an example of a preliminarily prepared member according to a fourth embodiment.
Figure 30B:
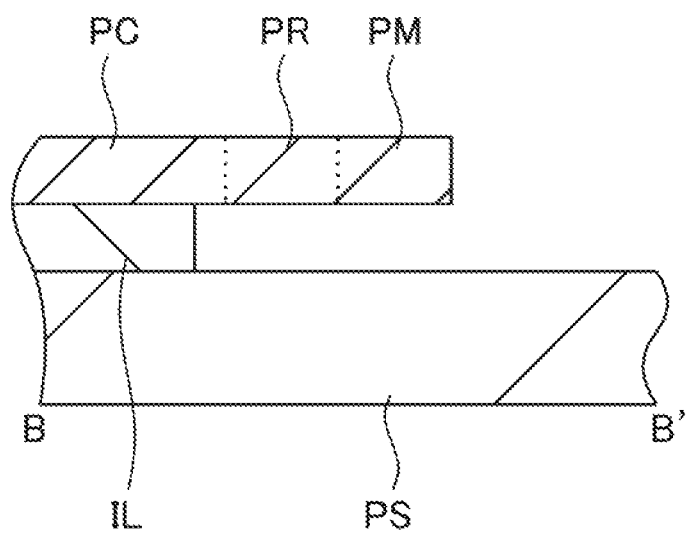
FIG. 30B is a sectional view taken along line B-B' of FIG. 30A.
Figure 31A:
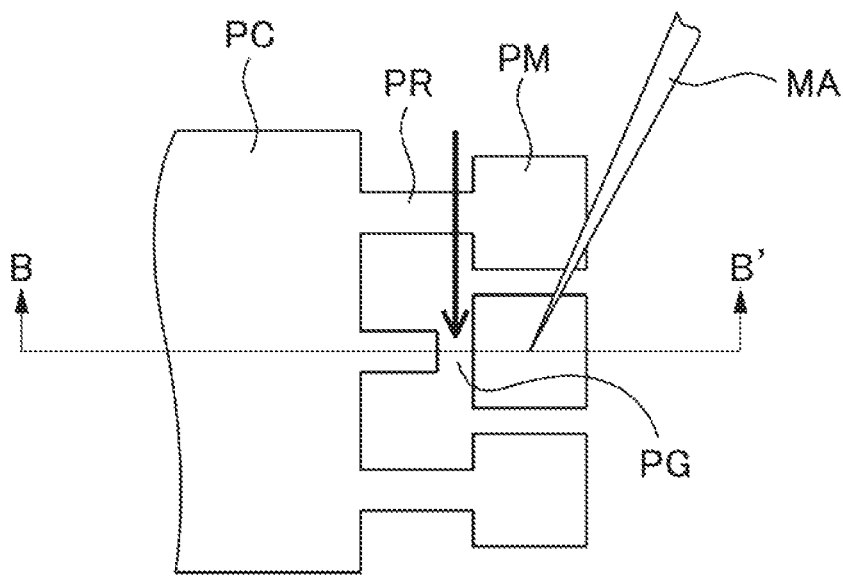
FIG. 31A is a plan view showing an example of a method of cutting the preliminarily prepared member according to the fourth embodiment.
Figure 31B:
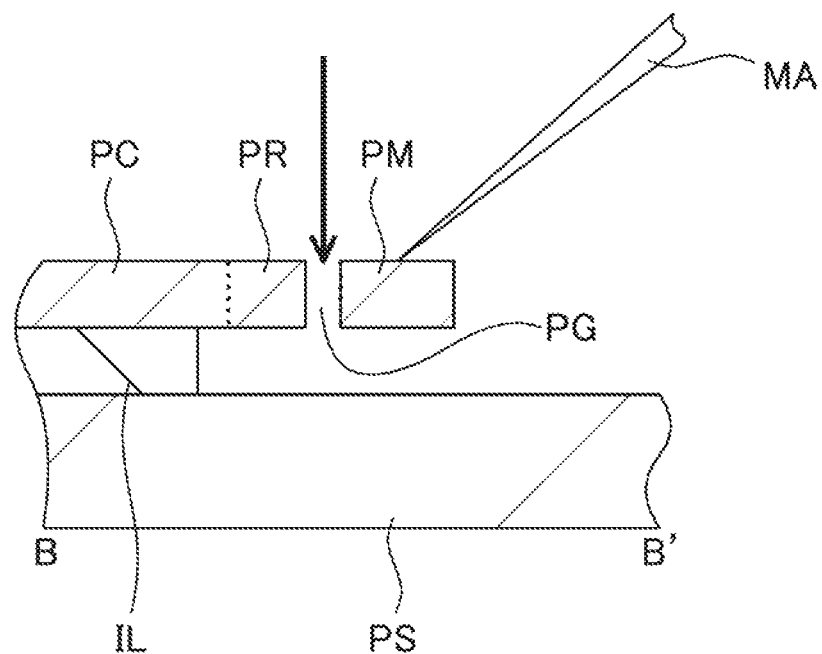
FIG. 31B is a sectional view taken along line B-B' of FIG. 31A.

A MEMS manufacturing method according to a fourth embodiment will be described referring to FIGS. 30 and 31. FIG. 30($a$) as a plan view and FIG. 30 ($b$) as a sectional view represent an example of a preliminarily prepared member according to the fourth embodiment. FIG. 31 ($a$) as a plan view and FIG. 31 ($b$) as a sectional view represent an example of a method for cutting the preliminarily prepared member according to the fourth embodiment.

For example, the FIB device may be configured to manufacture the members used in the first embodiment, the spring members and the mass members used in the second embodiment, and the unit blocks used in the third embodiment anew as needed. Preferably, the desired members or the unit blocks are produced by the FIB device and stored on the storage place so as to further shorten the MEMS manufacturing TAT.

Referring to FIGS. 30($a$) and 30($b$), according to the fourth embodiment, a plurality of preliminarily prepared members PM on the storage place are fixed onto a fixing section PC via a runner PR. The fixing section PC, the runner PR, and the member PM are formed as an integrated structure made from silicon, for example. The integrated structure is led to an insulation film IL applied onto the substrate PS at the fixing section PC. The insulation film IL is made from silicon oxide, for example. The fixing section PC is formed in contact with the insulation film IL, but is not formed on the area between the runner PR/member PM and the substrate PS. The runner PR and the member PM are apart from the substrate PS.

As FIGS. 31($a$) and ($b$) show, the FIB device irradiates ion beams to a gate PG at which the runner PR and the member PM are connected while supporting the member PM with the manipulator MA so as to cut the member PM from the fixing section PC.

Then the member PM is used for processing or assembling the MEMS with starting structure, for example, the acceleration sensor SSp with starting structure. Specifically, in the above-described first embodiment, the FIB device adds the cut-out member MW to the movable section 4 (process step of "(4) Processing of starting structure"). In the above-described second embodiment, for example, the FIB device assembles the cut-out spring member k8 and the mass member m5 (process steps of "(6) Pick-up of part" and "(7) Connection of part"), or adds the cut-out member MW to the spring member k8 or the mass member m5 (process step of "(9) Processing of starting structure"). In the above-described third embodiment, the FIB device assembles the cut-out unit blocks UB.

In the fourth embodiment, the FIB device preliminarily prepares the members on the storage place so as to pick up the member required for processing or assembling the MEMS with starting structure. This makes it possible to shorten the MSMS manufacturing TAT.

As described above, the present invention has been described in reference to the embodiments in non-restrictive manners. It is to be clearly understood that the present invention may be changed and modified into various forms without departing from the scope of the present invention.

LIST OF REFERENCE SIGNS

1: support substrate,
2: fixed section,
3: support beam,
4: movable section,
7: electron gun,
8: electron beam,
14: sample stage control unit,
16: manipulator control unit,
18: gas source control unit,
19: secondary particle detector control unit,
31: ion source,
81: ion source control unit,
82: lens control unit,
85: calculation process unit,
86: database,
a2: anchor,
k8: spring member,
m5: mass member,
CC1, CC2: correlation diagram,
CF: natural frequency,
CFm: natural frequency of required specification,
CFp: natural frequency of design specification,
M1, M2: mark,
MW: member,
SC, SCp: semiconductor chip,
SM: support member,
SS, SSM, SSp, SSpO: acceleration sensor,
UB: unit block

The invention claimed is:

1. A MEMS manufacturing method comprising:
   (a) a step of preparing a correlation diagram between a parameter of the MEMS and a device characteristic;
   (b) a step of preliminarily forming a plurality of MEMS each having a parameter and a device characteristic corresponding to the correlation diagram, on a main surface of a substrate;
   (c) a step of selecting a first characteristic in a region approximate to a required characteristic from the correlation diagram;
   (d) a step of selecting a first MEMS having the first characteristic on the basis of the correlation diagram from the plurality of MEMS preliminarily prepared on the main surface of the substrate; and
   (e) a step of forming a second MEMS having the required characteristic by directly processing the first MEMS.

2. The MEMS manufacturing method according to claim 1,
   wherein each of the plurality of MEMS in the step (b) has a different parameter, and
   in the step (e), a processing position of the first MEMS is located in reference to a position mark formed on the first MEMS.

3. The MEMS manufacturing method according to claim 1,
   wherein each of the plurality of MEMS in the step (b) has a different parameter, and
   the step (e) includes at least one of cutting a part of the first MEMS, bonding a member onto the first MEMS, and accumulating a film on the first MEMS.

4. The MEMS manufacturing method according to claim 1,
   wherein each of the plurality of MEMS in the step (b) has a different parameter, and
   the parameter is at least one of a structure parameter and a physical parameter.

5. The MEMS manufacturing method according to claim 1,
   wherein each of the plurality of MEMS in the step (b) has a different parameter,
   each of the plurality of MEMS is an acceleration sensor having a support beam and a movable section, and
   the parameter includes a spring constant of the support beam and a mass of the movable section.

6. A MEMS manufacturing method comprising the steps of:
   (a) preparing a correlation diagram between a parameter and a device characteristic of the MEMS;
   (b) preliminarily preparing a plurality of members each having the parameter corresponding to the correlation diagram;
   (c) selecting a first characteristic in a range approximate to a required characteristic, from the correlation diagram;
   (d) selecting a plurality of components on the basis of the correlation diagram from the plurality of members preliminarily prepared;
   (e) forming a first MEMS with a first characteristic in a range approximate to a required characteristic by assembling the plurality of components on a main surface of a substrate; and
   (f) forming a second MEMS with the required characteristic by directly processing the first MEMS.

7. The MEMS manufacturing method according to claim 6,
   wherein the plurality of components are assembled in reference to a position mark formed on the substrate in the step (e), and
   a processing position of the first MEMS is located in reference to the position mark in the step (f).

8. The MEMS manufacturing method according to claim 6,
   wherein the step (f) includes at least one of cutting a part of the first MEMS, bonding a member onto the first MEMS, and accumulating a film on the first MEMS.

9. The MEMS manufacturing method according to claim 6,
   wherein the plurality of components are bonded with one another using carbon.

10. The MEMS manufacturing method according to claim 6,
   wherein each of the plurality of members includes at least one of structure parameters and physical parameters, the members having different structure parameters and different physical parameters.

11. The MEMS manufacturing method according to claim 6,
wherein each of the plurality of members includes the structure parameters and the physical parameters, the members having the same structure parameters and the same physical parameters.

12. The MEMS manufacturing method according to claim 6,
wherein the first MEMS is an acceleration sensor with an anchor, a support beam, and a movable section, and each of the anchor, the support beam, and the movable section is formed of a single unit of the components.

* * * * *